(12) United States Patent
Naruse

(10) Patent No.: US 9,392,694 B2
(45) Date of Patent: Jul. 12, 2016

(54) PACKAGE, ELECTRONIC DEVICE, METHOD OF MANUFACTURING ELECTRONIC DEVICE, ELECTRONIC APPARATUS, AND MOBILE BODY

(71) Applicant: Seiko Epson Corporation, Tokyo (JP)

(72) Inventor: Atsuki Naruse, Shiojiri (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 14/693,059

(22) Filed: Apr. 22, 2015

(65) Prior Publication Data
US 2015/0313016 A1    Oct. 29, 2015

(30) Foreign Application Priority Data
Apr. 23, 2014    (JP) ................. 2014-088893

(51) Int. Cl.
| | |
|---|---|
| *G01C 25/00* | (2006.01) |
| *G01P 3/44* | (2006.01) |
| *B81B 7/00* | (2006.01) |
| *H05K 1/11* | (2006.01) |
| *B81C 1/00* | (2006.01) |
| *H05K 1/03* | (2006.01) |
| *H05K 1/18* | (2006.01) |
| *G01P 1/02* | (2006.01) |

(Continued)

(52) U.S. Cl.
CPC ............ *H05K 1/115* (2013.01); *B81C 1/00293* (2013.01); *B81C 1/00539* (2013.01); *G01P 1/023* (2013.01); *G01P 15/125* (2013.01); *H05K 1/0306* (2013.01); *H05K 1/181* (2013.01); *G01P 2015/0814* (2013.01); *H05K 2201/09545* (2013.01); *H05K 2201/09827* (2013.01)

(58) Field of Classification Search
CPC ........ B81B 7/0041; B81B 7/00; G01C 25/00; G01P 3/44
USPC ............................................ 73/488
See application file for complete search history.

(56) References Cited

U.S. PATENT DOCUMENTS

| | | | |
|---|---|---|---|
| 7,557,491 B2 | 7/2009 | Kigawa et al. | |
| 7,795,585 B2 | 9/2010 | Sogawa et al. | |
| 9,247,664 B2 * | 1/2016 | Takizawa | ............... H05K 5/069 |

(Continued)

FOREIGN PATENT DOCUMENTS

| | | |
|---|---|---|
| JP | 2004-266763 A | 9/2004 |
| JP | 2007-214315 A | 8/2007 |

(Continued)

*Primary Examiner* — Lisa Caputo
*Assistant Examiner* — Jamel Williams
(74) *Attorney, Agent, or Firm* — Harness, Dickey & Pierce, P.L.C.

(57) ABSTRACT

A package includes an accommodation space portion, and a first base body that forms at least a part of the accommodation space portion. A first through-hole, which extends toward a second surface on an accommodation space portion side from a first main surface opposite to the accommodation space portion, is provided in the first base body, in a cross-sectional view of the first through-hole, the first through-hole includes a first inclined portion that is inclined from the second surface toward the first main surface, and a second inclined portion that is inclined from one end on a first main surface side of the first inclined portion toward the first main surface, a second angle made by the second inclined portion and the second surface is larger than a first angle made by the first inclined portion and the second surface, and the first through-hole is sealed with a sealing member.

11 Claims, 14 Drawing Sheets

(51) Int. Cl.
 *G01P 15/125* (2006.01)
 *G01P 15/08* (2006.01)

(56) References Cited

U.S. PATENT DOCUMENTS

2009/0195125 A1* 8/2009 Matsugi ............... H01L 23/10
                                                            310/348
2013/0074596 A1* 3/2013 Takizawa ............ B81B 7/0041
                                                            73/504.12
2015/0135841 A1* 5/2015 Kato ..................... B81B 3/0021
                                                            73/655

FOREIGN PATENT DOCUMENTS

| | | |
|---|---|---|
| JP | 2009-135296 A | 6/2009 |
| JP | 2010-114582 A | 5/2010 |
| JP | 2010-154480 A | 7/2010 |
| JP | 2011-035436 A | 2/2011 |
| JP | 2013-102036 A | 5/2013 |
| JP | 2015-004517 A | 1/2015 |

* cited by examiner

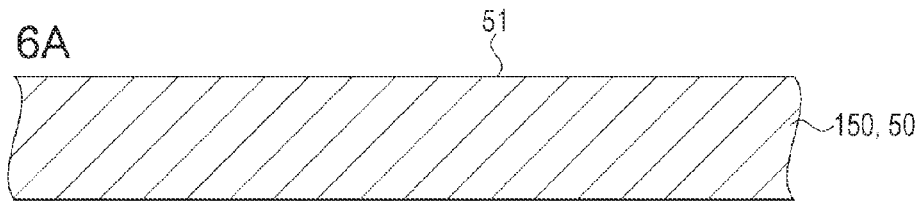
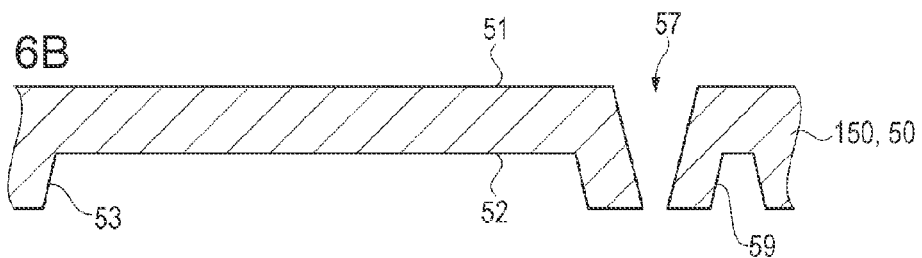
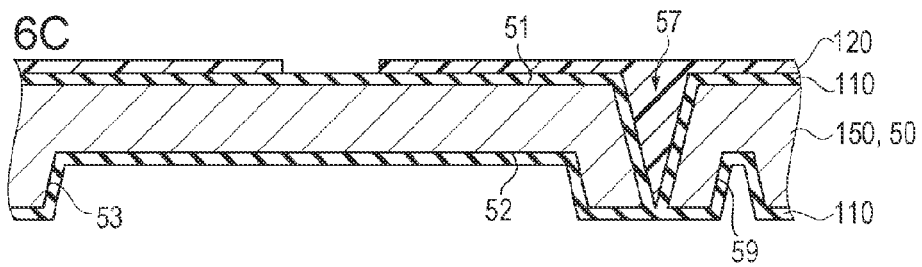
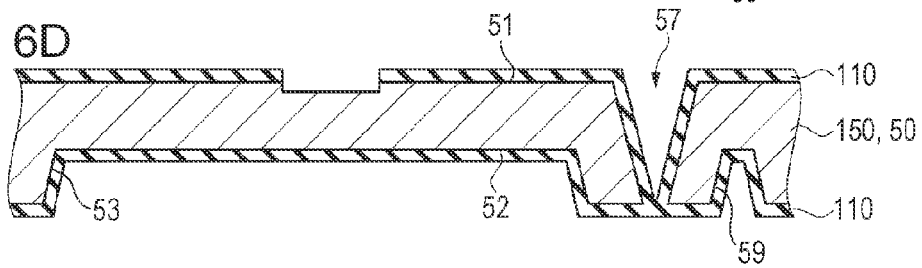
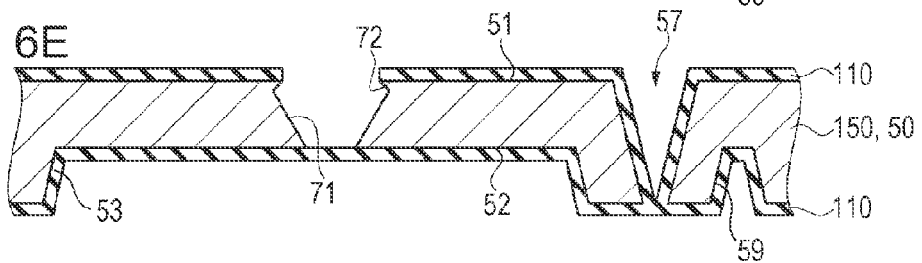
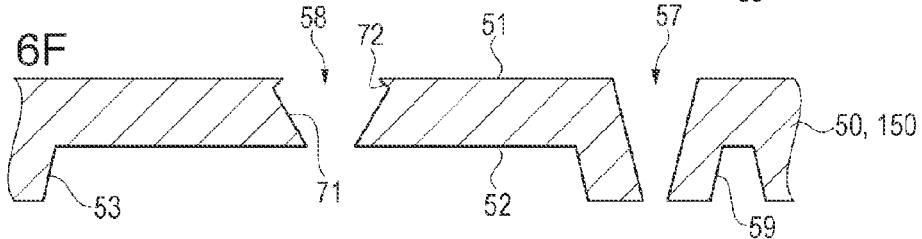

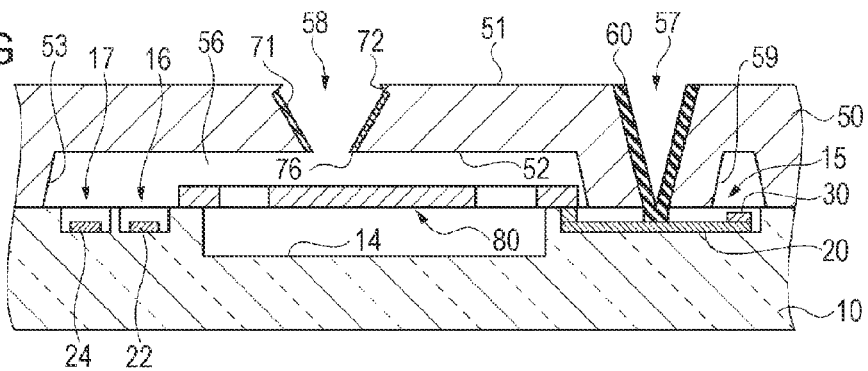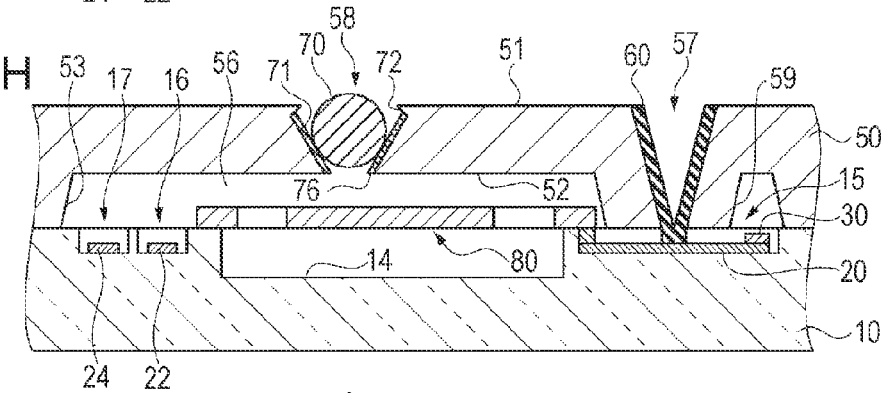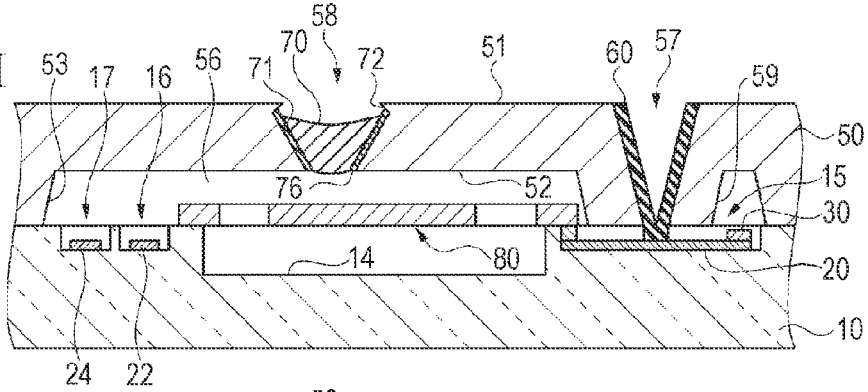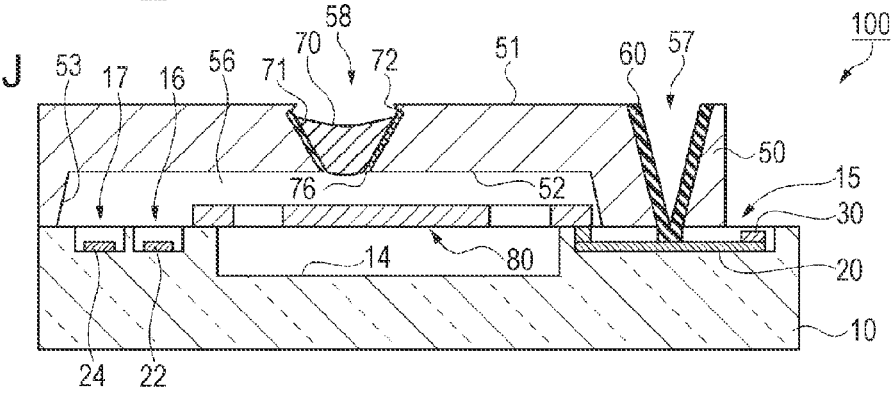

PACKAGE, ELECTRONIC DEVICE, METHOD OF MANUFACTURING ELECTRONIC DEVICE, ELECTRONIC APPARATUS, AND MOBILE BODY

BACKGROUND

1. Technical Field

The present invention relates to a package, an electronic device, a method of manufacturing an electronic device, an electronic apparatus, and a mobile body.

2. Related Art

In the related art, with regard to vehicle body control in a vehicle, and own vehicle position detection of a car navigation system, or in an electronic apparatus such as a digital still camera, a video camera, and a portable telephone, and a mobile body such as an automobile, an electronic device such as a vibrator, an oscillator, an acceleration sensor, and an angular velocity sensor, in which a functional element is accommodated in a package having an internal space, has been used. In the electronic device package that is used in the movable body and the electronic apparatus, high air-tightness is demanded to improve the function of the functional element. For example, as described in JP-A-2004-266763, there is known a package in which a through-hole that communicates with the inside and outside of an internal space is provided, a sealing material is disposed in the through-hole, and the sealing material is melted to clog the through-hole, and thus the internal space is air-tightly sealed.

However, the through-hole that is provided in the package described in JP-A-2004-266763 has a shape (tapered shaped) in which an inner diameter gradually decreases from the outer side of the inner space to the inner side thereof when viewed from a cross-section of the through-hole, and a metal film (metal coating) is provided on the entirety of an inner peripheral surface of the through-hole. According to this, when the sealing member is melted at the inside of the through-hole, there is a concern that the melted sealing member climbs up the inner peripheral surface of the through-hole, and thus the sealing member may flow out to a surface of a first main body, which is opposite to an accommodation space portion (inner space), from the through-hole. Therefore, there is a problem in that when poor sealing occurs due to deficiency of the sealing member inside the through-hole, or when cracks occur in the first base body due to heat of the sealing member that is extruded, air-tightness of the accommodation space portion may be damaged.

SUMMARY

The invention can be realized in the following forms or application examples.

Application Example 1

According to this application example, there is provided a package including an accommodation space portion, and a first base body that forms at least a part of the accommodation space portion. A first through-hole, which extend toward a second surface on an accommodation space portion side from a first main surface opposite to the accommodation space portion, is provided in the first base body, in a cross-section view of the first through-hole, the first through-hole includes a first inclined portion that is inclined from the second surface toward the first main surface, and a second inclined portion that is inclined from one end on a first main surface side of the first inclined portion toward the first main surface, a second angle made by the second inclined portion and the second surface is larger than a first angle made by the first inclined portion and the second surface, and the first through-hole is sealed with a sealing member.

According to this application example, the package is provided with the accommodation space portion, and the first though-hole that air-tightly seals the accommodation space portion. The accommodation space portion is air-tightly sealed by melting a spherical sealing member that is disposed inside the first through-hole, for example, through laser irradiation so as to clog the first through-hole with the sealing member. The first through-hole is provided in the first base body that forms the accommodation space portion, and passes through the first base body from the first main surface opposite to the accommodation space portion toward the second surface on an accommodation space portion side. In a cross-sectional view of the first through-hole, the first through-hole includes two inclined portions which are provided in the order of the first inclined portion and the second inclined portion from the second surface of the first base body toward the first main surface.

The second angle on a first base body side which is made by the second inclined portion and the second surface is larger than the first angle on a first base body side which is made by the first inclined portion and the second surface. Accordingly, when melting the spherical sealing member that is disposed in the first inclined portion of the first through-hole, it is possible to prevent the sealing member that is melted from climbing up the second inclined portion and flowing out to the first main surface of the first base body from the first through-hole. According to this, it is possible to suppress poor sealing due to deficiency of the sealing member inside the first through-hole, or occurrence of cracks in the first base body due to heat of the sealing member that is melted. As a result, it is possible to provide a package in which air-tightness of the accommodation space portion is improved.

Application Example 2

In the package according to the application example, it is preferable that the second angle exceeds 90°.

According to this application example, in the second inclined portion of the first through-hole, the second angle on a first base body side which is made by the second inclined portion and the second surface in a cross-sectional view of the first through-hole exceeds 90°. Accordingly, when melting the spherical sealing member that is disposed in the first inclined portion of the first through-hole, it is possible to improve the effect of preventing the sealing member that is melted from climbing up the second inclined portion and flowing out to the first main surface of the first base body from the first through-hole.

Application Example 3

In the package according to the application example, it is preferable that a metal film is provided in the first through-hole, and the first base body is exposed at least at a part of the second inclined portion.

According to this application example, the metal film is provided on an inner wall of the first inclined portion of the first through-hole. Accordingly, when melting the spherical sealing member that is disposed in the first inclined portion, the sealing member that is melted wet-spreads in the first inclined portion of the first through-hole, and thus it is possible to reliably seal the first through-hole with the sealing member. In addition, the first base body is exposed at least at a part of the second inclined portion. In other words, the second inclined portion has a region in which the metal film is not provided. Accordingly, when melting the spherical sealing member that is disposed in the first inclined portion, it is possible to reduce the wet-spreading (climbing up) of the sealing member that is melted in the region in which the metal film is not provided. As a result, it is possible to further improve the effect of preventing the sealing member that is melted from climbing up the second inclined portion and flowing out to the first main surface of the first base body from the first through-hole.

Application Example 4

In the package according to the application example, it is preferable that the first base body includes silicon as a main material, and the first main surface is formed along a (1,0,0) crystal face of silicon.

According to this application example, as the main material of the first base body, silicon having (1,0,0) face orientation with respect to the first main surface in which the first through-hole is formed is used. When wet etching is performed from a first main surface side toward the second surface by using an anisotropic silicon etching technology, it is possible to easily form inclination of the first inclined portion or the second inclined portion.

Application Example 5

According to this application example, there is provided an electronic device including an accommodation space portion, a first base body that forms at least a part of the accommodation space portion, and a functional element that is accommodated in the accommodation space portion. A first through-hole, which extends toward a second surface on an accommodation space portion side from a first main surface opposite to the accommodation space portion, is provided in the first base body, in a cross-sectional view of the first through-hole, the first through-hole includes a first inclined portion that is inclined from the second surface toward a first main surface side, and a second inclined portion that is inclined from one end on a first main surface side of the first inclined portion toward the first main surface side, a second angle made by the second inclined portion and the second surface is larger than a first angle made by the first inclined portion and the second surface, and the first through-hole is sealed with a sealing member.

According to this application example, the electronic device is provided with the accommodation space portion in which the functional element is accommodated, and the first though-hole that air-tightly seals the accommodation space portion. The accommodation space portion is air-tightly sealed by melting a spherical sealing member that is disposed inside the first through-hole, for example, through laser irradiation so as to clog the first through-hole with the sealing member. The first through-hole is provided in the first base body that forms the accommodation space portion, and passes through the first base body from the first main surface opposite to the accommodation space portion toward the second surface on an accommodation space portion side. In a cross-sectional view of the first through-hole, the first through-hole includes two inclined portions which are provided in the order of the first inclined portion and the second inclined portion from the second surface of the first base body toward the first main surface.

The second angle on a first base body side which is made by the second inclined portion and the second surface is larger than the first angle on a first base body side which is made by the first inclined portion and the second surface. Accordingly, when melting the spherical sealing member that is disposed in the first inclined portion of the first through-hole, it is possible to prevent the sealing member that is melted from climbing up the second inclined portion and flowing out to the first main surface of the first base body from the first through-hole. According to this, it is possible to suppress poor sealing due to deficiency of the sealing member inside the first through-hole, or occurrence of cracks in the first base body due to heat of the sealing member that is melted. As a result, it is possible to provide an electronic device with high reliability in which air-tightness is improved.

Application Example 6

According to this application example, there is provided a method of manufacturing an electronic device. The method includes half-etching a first main surface of a first base body in a dry process, and forming a first inclined portion and a second inclined portion of a first through-hole through etching in a wet process. The electronic device includes an accommodation space portion, the first base body that forms at least a part of the accommodation space portion, and a functional element that is accommodated in the accommodation space portion, the first through-hole, which extends toward a second surface on an accommodation space portion side from a first main surface opposite to the accommodation space portion, is provided in the first base body, in a cross-sectional view of the first through-hole, the first through-hole includes the first inclined portion that is inclined from the second surface toward a first main surface side, and the second inclined portion that is inclined from one end on a first main surface side of the first inclined portion toward the first main surface side, a second angle made by the second inclined portion and the second surface is larger than a first angle made by the first inclined portion and the second surface, the first through-hole is sealed with a sealing member, the first base body includes silicon as a main material, and the first main surface is formed along a (1,0,0) crystal face of silicon.

According to this application example, the method of manufacturing the electronic device includes half-etching the first main surface of the first base body in a dry process, and etching the first inclined portion and the second inclined portion in a wet process.

As the main material of the first base body, silicon having a (1,0,0) crystal face with respect to the first main surface in which the first through-hole is formed, is used. When the first base body is subjected to the half-etching from the first main surface toward the second surface by using a dry process, a concave portion is formed in the first main surface. Next, when wet etching is performed from a concave portion side to the second surface by using an anisotropic silicon etching technology, the first through-hole including the first inclined portion and the second inclined portion is formed.

In a cross-sectional view of the first through-hole, the second angle that is made by the second inclined portion and the second surface is larger than the first angle that is made by the first inclined portion and the second surface, and the second angle is larger than 90°. In other words, an inner wall of the second inclined portion extends in an overhang shape from one end on a first main surface side of the first inclined portion toward the first main surface. According to this shape, when melting the spherical sealing member that is disposed in the first inclined portion, it is possible to prevent the sealing member that is melted from climbing up the second inclined portion and flowing out to the first main surface from the first through-hole. According to this, it is possible to suppress poor sealing due to deficiency of the sealing member inside the first through-hole, or occurrence of cracks in the first base body due to heat of the sealing member that is melted. As a result, it is possible to provide a method of manufacturing an electronic device in which air-tightness is improved.

Application Example 7

According to this application example, there is provided a method of manufacturing an electronic device. The method includes forming a first main surface of a first base body through etching of a wet process, and forming a second inclined portion of a first through-hole through etching of a dry process. The electronic device includes an accommodation space portion, the first base body that forms at least a part of the accommodation space portion, and a functional element that is accommodated in the accommodation space portion, the first through-hole, which extends toward a second surface on an accommodation space portion side from a first main surface opposite to the accommodation space portion, is provided in the first base body, in a cross-sectional view of the first through-hole, the first through-hole includes the first inclined portion that is inclined from the second surface toward a first main surface side, and the second inclined portion that is inclined from one end on a first main surface side of the first inclined portion toward the first main surface side, a second angle made by the second inclined portion and the second surface is larger than a first angle made by the first inclined portion and the second surface, the first through-hole is sealed with a sealing member, the first base body includes silicon as a main material, and the first main surface is formed along a (1,0,0) crystal face of silicon.

According to this application example, the method of manufacturing the electronic device includes wet-etching the first base body from a first main surface side in a wet process, and etching the first base body from the first main surface side in a dry process to form the second inclined portion.

As the main material of the first base body, silicon having a (1,0,0) crystal face with respect to the first main surface in which the first through-hole is formed, is used. When wet etching is performed from the first main surface to the second surface by using an anisotropic silicon etching technology, in a cross-sectional view, it is possible to form a through-hole having a shape (tapered shape) in which an inner diameter gradually decreases from the first main surface toward the second surface. Next, the outer periphery of the through-hole is masked, and then dry etching is performed from the first main surface toward the second surface, and thus the first through-hole including the first inclined portion and the second inclined portion is formed.

In a cross-sectional view of the first through-hole, the second angle that is made by the second inclined portion and the second surface is larger than the first angle that is made by the first inclined portion and the second surface, and the second angle is approximately 90°. In other words, the second inclined portion has an inner wall that is erected from one end on a first main surface side of the first inclined portion toward the first main surface in a direction intersecting the second surface. According to this shape, when melting the spherical sealing member that is disposed in the first inclined portion, it is possible to prevent the sealing member that is melted from climbing up the second inclined portion and flowing out to the first main surface from the first through-hole. According to this, it is possible to suppress poor sealing due to deficiency of the sealing member inside the first through-hole, or occurrence of cracks in the first base body due to heat of the sealing member that is melted. As a result, it is possible to provide a method of manufacturing an electronic device in which air-tightness is improved.

Application Example 8

According to this application example, there is provided an electronic apparatus including the electronic device according to the application example.

According to this application example, it is possible to provide an electronic apparatus provided with the electronic device in which air-tightness is improved.

Application Example 9

According to this application example, there is provided a mobile body including the electronic device according to the application example.

According to this application example, it is possible to provide a mobile body provided with the electronic device in which air-tightness is improved.

BRIEF DESCRIPTION OF THE DRAWINGS

The invention will be described with reference to the accompanying drawings, wherein like numbers reference like elements.

FIGS. 6A to 6F are cross-sectional views for main processes of the electronic device.

FIGS. 7G to 7J are cross-sectional views for main processes of the electronic device.

DESCRIPTION OF EXEMPLARY EMBODIMENTS

Hereinafter, embodiments of the invention will be described with reference to the accompanying drawings. In addition, in the following respective drawings, the scales of respective layers or respective members are made different from actual scales to illustrate the respective layers or the respective members in a recognizable size. In addition, the following dimensional values are illustrative only, and may be appropriately changed in a range not departing from the gist of the invention.

In FIG. 1 to FIG. 4, FIG. 8, FIG. 9, and FIGS. 16A and 16B, an X-axis, a Y-axis, and a Z-axis as three axes which are perpendicular to each other are illustrated for convenience of explanation, and a tip end side of an arrow illustrating an axial direction is set as a "+" side, and a base end side thereof is set as a "−" side. In addition, hereinafter, a direction that is parallel with the X-axis is referred to as an "X-axis direction", a direction that is parallel with the Y-axis is referred to as a "Y-axis direction", and a direction that is parallel with the Z-axis is referred to as a "Z-axis direction".

First Embodiment

This embodiment relates to an electronic device using a package that has an air-tight structure, and may be used, for example, as an inertial sensor. Specifically, the electronic device may be used as a sensor (electrostatic capacitance type acceleration sensor) that obtains acceleration. In addition, the invention is not limited to the acceleration sensor, and is applicable to an angular velocity sensor and various devices in which an air-tight structure is necessary.

Figure 1:
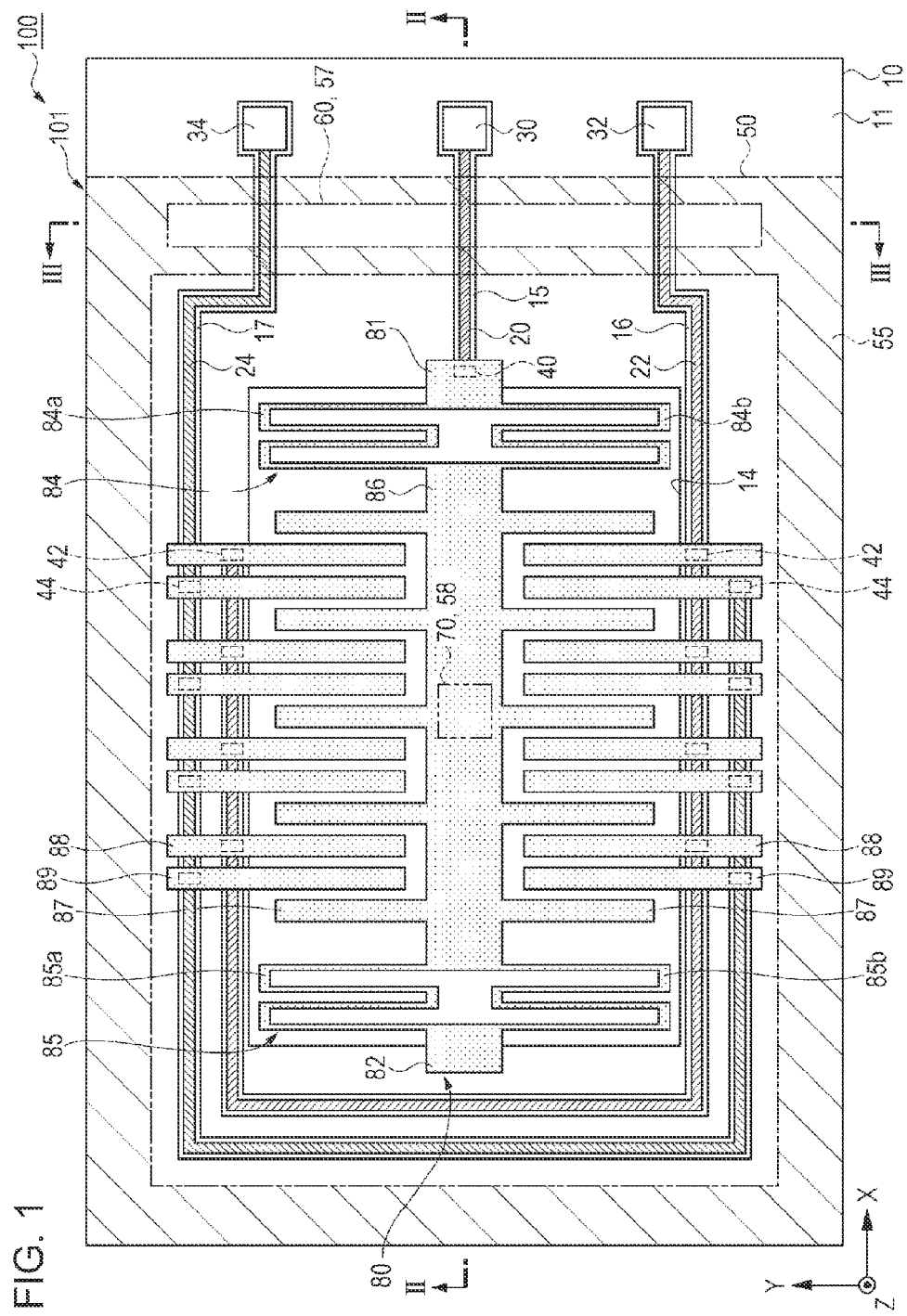
FIG. 1 is a schematic plan view illustrating a schematic configuration of an electronic device according to a first embodiment.
Figure 2:
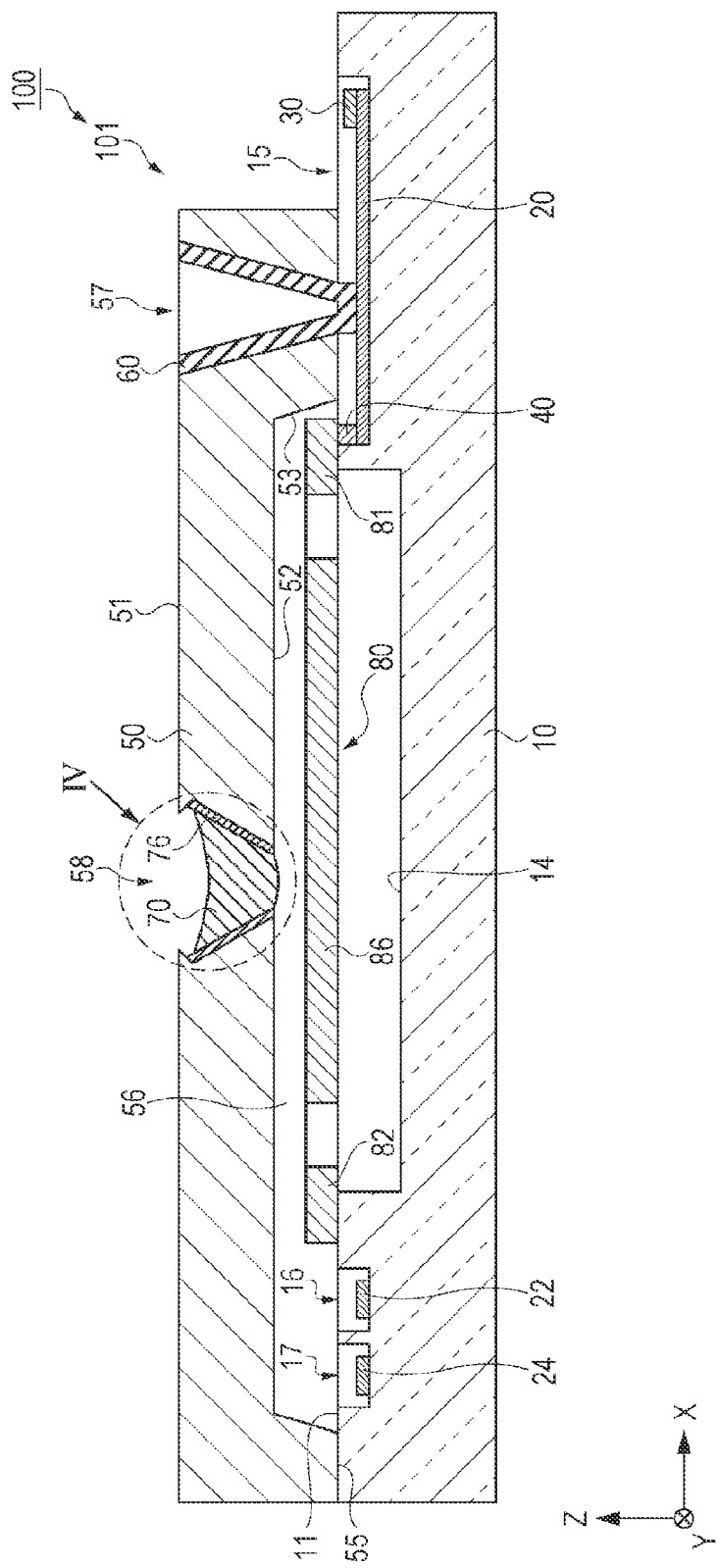
FIG. 2 is a cross-sectional view taken along line II-II in FIG. 1.
Figure 3:
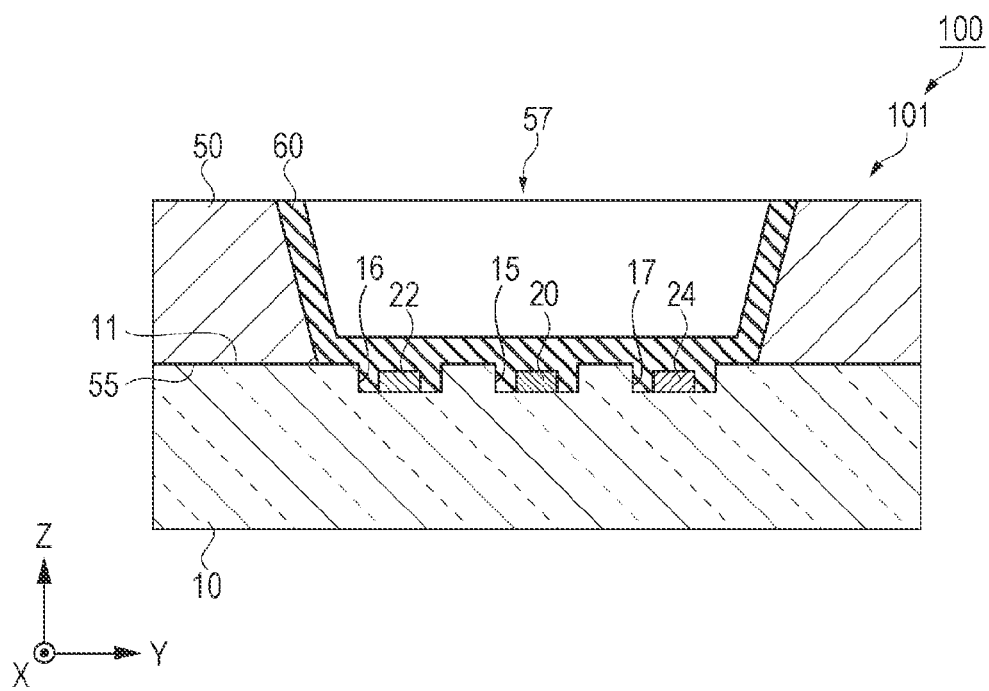
FIG. 3 is a cross-sectional view taken along line III-III in FIG. 1.
Figure 4:
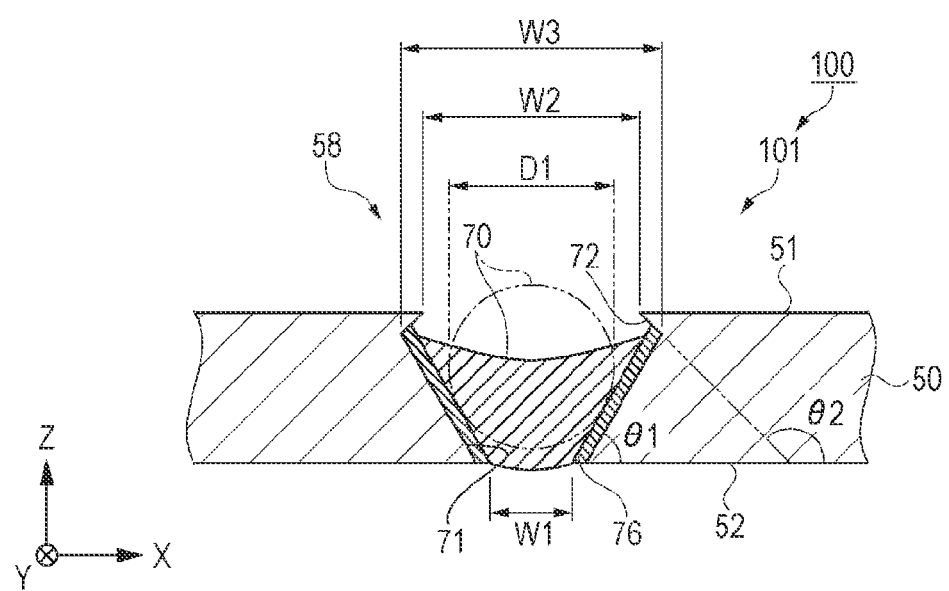
FIG. 4 is an enlarged view of a portion IV in FIG. 2.

FIG. 1 is a schematic plan view illustrating a schematic configuration of an electronic device 100 according to this embodiment. FIG. 2 is a cross-sectional view taken along line II-II in FIG. 1. FIG. 3 is a cross-sectional view taken along line III-III in FIG. 1. FIG. 4 is an enlarged view of a portion IV in FIG. 2.

First, a schematic configuration of the electronic device 100 according to this embodiment will be described with reference to FIGS. 1 to 4.

As illustrated in FIGS. 1 and 2, a package 101 includes a second base body 10, a first base body 50, a filling member 60, a sealing member 70, and the like. The electronic device 100 includes the package 101, a functional element 80, and the like. In addition, in FIG. 1, the first base body 50, the filling member 60, and the sealing member 70 are illustrated in a projection manner for convenience of explanation.

First, a configuration of an accommodation space portion 56 in which the functional element 80 is accommodated will be described.

As illustrated in FIGS. 1 and 2, the second base body 10 has a thickness of 0.3 mm and has a rectangular plate shape having dimensions of 1.5 mm×1.2 mm. A concave portion 14 having a rectangular shape in a plan view is provided on a first main surface 11 (surface on +Z-axis side) of the second base body 10.

The first base body 50 has a cap shape in which a concave portion 53 is provided and which has a thickness of 0.18 mm. The first base body 50 is bonded to the second base body 10 at a bonding region 55. The bonding is performed in such a manner that the concave portion 14 of the second base body 10 and the concave portion 53 of the first base body 50 face each other, and thus an accommodation space portion 56 in which the functional element 80 is accommodated is provided.

However, the shape of the concave portion 14 is described as a rectangular shape, but there is no limitation thereto as long as the functional element 80 can be accommodated without hindering displacement of a movable electrode 87 to be described later.

As a material of the second base body 10 and the first base body 50, for example, silicon, glass, and the like can be used. As a method of bonding the second base body 10 and the first base body 50, for example, a bonding method using an adhesive, an anode bonding method, a direct bonding method, and the like can be used. In this embodiment, as an appropriate example, glass is used for the second base body 10, and silicon is used for the first base body 50. According to this, the second base body 10 and the first base body 50 can be bonded to each other through the anode bonding method. According to the anode bonding method, bonding strength is higher in comparison to a bonding method using an adhesive or glass, and thus a bonding width of the bonding region 55 can be made to be as narrow as several tens of micrometers. According to this, miniaturization of the electronic device 100 (package 101) can be realized.

For example, the concave portion 14 of the second base body 10, and the concave portion 53 of the first base body 50 can be formed by processing silicon, glass, or the like by using various processing technologies (for example, etching technologies such as dry etching and wet etching).

In addition, glass that is used for the second base body 10 has insulating properties, and thus interconnections 20, 22, and 24 to be described later can be insulated from each other even though an outer surface of the second base body 10 is not subjected to an insulation treatment.

Next, the functional element 80 that is accommodated in the accommodation space portion 56 will be described.

As illustrated in FIGS. 1 and 2, the functional element 80 is disposed in the accommodation space portion 56 that is provided between the second base body 10 and the first base body 50. The functional element 80 includes stationary portions 81 and 82, a movable portion 86, a connection portion 84 that connects the stationary portion 81 and the movable portion 86, a connection portion 85 that connects the stationary portion 82 and the movable portion 86, a plurality of movable electrodes 87 which extend from the movable portion 86, and a plurality of stationary electrodes 88 and 89.

The movable portion 86 has a rectangular shape that extends along the X-axis direction. The movable portion 86 is bonded to the first main surface 11 of the second base body 10 at the stationary portions 81 and 82 through the connection portions 84 and 85.

The connection portion 84 or 85 connects the movable portion 86, and the stationary portion 81 or the stationary portion 82.

In a plan view from the +Z-axis direction, ends on one side of a pair of connection portions 84a and 84b, which are displaceable in ±X-axis directions, are connected to a side surface of the movable portion 86 in the +X-axis direction, and ends on the other side of the connection portions 84a and 84b are connected to a side surface of the stationary portion 81 in the −X-axis direction. Ends on one side of a pair of connection portions 85a and 85b, which are displaceable in ±X-axis directions, are connected to a side surface of the movable portion 86 in the −X-axis direction, and ends on the other side of the connection portions 85a and 85b are connected to a side surface of the stationary portion 82 in the +X-axis direction.

The connection portions 84 and 85 have a shape that extends in the X-axis direction while reciprocating in the Y-axis direction. In addition, the connection portions 84 and 85 have a configuration in which a width in the Z-axis direction is thicker than a width in the X-axis direction. When the connection portions 84 and 85 are set to have the above-described shape, deformation of the connection portions 84 and 85 in the Y-axis direction and the Z-axis direction is suppressed, and the connection portions 84 and 85 can smoothly expand and contract in the ±X-axis directions. According to this, the movable portion 86 is supported to the stationary portions 81 and 82 in a displaceable manner in the ±X-axis directions. In addition, as the shape of the connection portions 84 and 85, a different shape may be used as long as a predetermined spring constant is provided and elastic deformation in the ±X-axis directions is possible.

The movable electrodes 87 are connected to the movable portion 86. In a plan view in the +Z-axis direction, the movable electrodes 87 protrude from both side surfaces of the movable portion 86 in the Y-axis direction toward a +Y-axis side and a −Y-axis side. The plurality of movable electrodes 87 are provided along the X-axis direction in a comb-teeth shape.

The stationary portions 81 and 82 are bonded to the first main surface 11 of the second base body 10. In a plan view from the +Z-axis direction, the stationary portion 81 is bonded to the central edge (the first main surface 11) on a +X-axis side of the concave portion 14 that is provided to the second base body 10, and the stationary portion 82 is bonded to the central edge (first main surface 11) on a −X-axis side of the concave portion 14. The stationary portions 81 and 82 are integrally formed with the movable portion 86, the movable electrodes 87, and the connection portions 84 and 85, and are provided across the concave portion 14.

The stationary electrodes 88 and 89 are bonded to the first main surface 11 of the second base body 10.

In a plan view from the +Z-axis direction, ends on one side of the stationary electrodes 88 and 89 are bonded to an edge on a +Y-axis side or on a −Y-axis side of the concave portion 14 that is provided to the second base body 10 (the first main surface 11 of the second base body 10), and ends on the other side extend in a Y-axis direction toward the movable portion 86. The stationary electrode 88 and the stationary electrode 89 make a pair, and a plurality of pairs of the stationary electrodes 88 and 89 are provided along the X-axis direction in a comb-teeth shape.

A pair of the stationary electrodes 88 and 89, and each of the movable electrodes 87 are disposed to face each other with a comb-teeth distance therebetween.

For example, the functional element 80 is formed from a material such as single-crystal silicon and polysilicon which include silicon as a main component. Silicon is processed to a desired external shape by using various processing technologies (for example, etching technologies such as dry etching and wet etching), and thus the stationary portions 81 and 82, the movable portion 86, the movable electrodes 87, and the connection portions 84 and 85 are integrally formed. When silicon is set as the main material, application of a fin processing technology which is used for manufacturing of a silicon semiconductor device is possible, and thus miniaturization of the electronic device 100 and high-sensitivity due to improvement in processing accuracy are realized, and excellent durability can be exhibited.

In addition, when silicon is doped with impurities such as phosphorous and boron, conductivity can be improved.

As described above, as the material of the second base body 10, glass is used. Accordingly, when silicon is used for the functional element 80, an anode bonding method can be used for bonding of the functional element 80 (stationary portions 81 and 82, and stationary electrodes 88 and 89), and the second base body 10. According to this, the functional element 80 can be miniaturized.

In addition, the material of the functional element 80, and the bonding method between the functional element 80 and the second base body 10 are illustrative only, and there is no limitation thereto.

Next, description will be made with respect to electrical connection of the functional element 80, and grooves 15, 16, and 17 which are provided to the second base body 10 with reference to FIGS. 1 and 2.

As illustrated in FIGS. 1 and 2, external connection terminals 30, 32, and 34, and grooves 15, 16, and 17 are provided in the first main surface 11 of the second base body 10.

In a plan view in the +Z-axis direction, the external connection terminals 30, 32, and 34 are provided at the outside of the accommodation space portion 56 along one side on a +X-axis side of the second base body 10.

In a state of not being filled with a filling member 60, the grooves 15, 16, and 17 communicate with the inside and outside of the accommodation space portion 56 that is provided between the second base body 10 and the first base body 50 along the X-axis direction. An interconnection 20 is provided at the inside (on the bottom surface) of the groove 15, an interconnection 22 is provided on the bottom surface of the groove 16, and an interconnection 24 is provided on the bottom surface of the groove 17.

The interconnection 20 includes a connection portion 40, which electrically connects the interconnection 20 and the stationary portion 81, on a surface on a +Z-axis side.

In the groove 15 and the interconnection 20, ends on an inner side of the accommodation space portion 56 are connected to the stationary portion 81 of the functional element 80 through the connection portion 40, and the other ends on an outer side of the accommodation space portion 56 are connected to the external connection terminal 30. In addition, the groove 15 is provided along the outer periphery of the external connection terminal 30. According to this, the movable electrodes 87 are electrically connected to the external connection terminal 30.

The interconnection 22 includes a plurality of connection portions 42, which electrically connect the interconnection 22 and the stationary electrodes 88, on a surface on a +Z-axis side.

In the groove 16 and the interconnection 22, ends on an inner side of the accommodation space portion 56 extend along the outer periphery of the concave portion 14 and are connected to the plurality of stationary electrodes 88 of the functional element 80 through the connection portion 42, and the other ends on an outer side of the accommodation space portion 56 are connected to the external connection terminal 32. In addition, the groove 16 is provided along the outer periphery of the outer connection terminal 32. According to this, the plurality of stationary electrodes 88 are electrically and serially connected to the external connection terminal 32.

The interconnection 24 includes a plurality of connection portions 44, which electrically connect the interconnection 24 and the stationary electrodes 89, on a surface on a +Z-axis side.

In the groove 17 and the interconnection 24, ends on an inner side of the accommodation space portion 56 extend along the outer periphery of the groove 16, and are connected to the plurality of stationary electrodes 89 of the functional element 80 through the connection portion 44, and the other ends on an outer side of the accommodation space portion 56 are connected to the external connection terminal 34. In addition, the groove 17 is provided along the outer periphery of the external connection terminal 34. According to this, the plurality of stationary electrodes 89 are electrically and serially connected to the external connection terminals 34.

The depth (d) of the grooves 15, 16, and 17 is 0.5 μm to 1.0 μm, and the thickness (t) of the interconnections 20, 22, and 24 is approximately 0.1 μm. When the depth (d) of the grooves 15, 16, and 17, and the thickness (t) of the interconnections 20, 22, and 24 are set to satisfy a relationship of d>t, it is possible to prevent the interconnections 20, 22, and 24 from protruding to an outer side (+Z-axis side) of the grooves 15, 16, and 17.

For example, the grooves 15, 16, and 17 can be formed by processing the second base body 10 by using various processing technologies (for example, etching technologies such as dry etching and wet etching).

As a material of the interconnections 20, 22, and 24, and the external connection terminals 30, 32, and 34, for example, oxides such as indium tin oxide (ITO), indium zinc oxide (IZO), $In_2O_3$, $SnO_2$, Sb-containing $SnO_2$, and Al-containing ZnO which are transparent conductive materials, metals such as gold (Au), platinum (Pt), silver (Ag), copper (Cu), aluminum (Al), titanium (Ti), tungsten (W), and chromium (Cr), alloys which include these metals as a main component, and the like can be used.

When the material of the interconnections 20, 22, and 24, and the external connection terminals 30, 32, and 34 is the transparent electrode material (particularly, ITO), in a case where the second base body 10 is transparent, for example, foreign matter and the like, which exist on an upper surface side (+Z-axis side) of the interconnections 20, 22, and 24, and the external connection terminals 30, 32, and 34, can be easily recognized from a lower surface side (−Z-axis side) of the second base body 10.

As a material of the connection portions 40, 42, and 44, for example, metals such as gold (Au), platinum (Pt), silver (Ag), copper (Cu), aluminum (Al), titanium (Ti), tungsten (W), and chromium (Cr), alloys which include these metals as a main component, and the like can be used. When using these materials, it is possible to make a contact resistance between the interconnections 20, 22, and 24, and the functional element 80 small.

For example, the interconnections 20, 22, and 24, the external connection terminals 30, 32, and 34, and the connection portions 40, 42, and 44 can be formed by forming a conductor layer (the above-described material) through a sputtering method, a CVD method, and the like, and patterning the conductor layer. The patterning is performed by using a photolithography technology, and an etching technology. In addition, the method of forming the conductor layer is illustrative only, and there is no limitation thereto.

Next, acceleration detection which is performed by the functional element 80 will be described.

When acceleration in an X-axis direction is applied to the functional element 80, the connection portions 84 and 85 expand and contract in the X-axis direction, and thus the movable portion 86 and the movable electrode 87 that is connected to the movable portion 86 are displaced in the X-axis direction (+X-axis direction or −X-axis direction).

For example, in a case where the movable electrode 87 is displaced in the +X-axis direction, a gap between the movable electrode 87 and the stationary electrode 88 expands, and thus the electrostatic capacitance that is formed between the movable electrode 87 and the stationary electrode 88 decreases. In addition, the gap between the movable electrode 87 and the stationary electrode 89 becomes narrow, and thus the electrostatic capacitance that is formed between the movable electrode 87 and the stationary electrode 89 increases. Accordingly, it is possible to obtain the acceleration that is applied to the functional element 80 by detecting the electrostatic capacitance between the external connection terminal 30 and the external connection terminal 32, and the electrostatic capacitance between the external connection terminal 30 and the external connection terminal 34.

Next, a first through-hole 58 and a second through-hole 57 which are provided in the first base body 50 will be described.

As illustrated in FIGS. 1 and 2, the first through-hole 58 and the second through-hole 57, which pass through the first base body 50 in the Z-axis direction, are provided in the first base body 50. The first base body 50 includes silicon as a main material, and a first main surface 51 is formed along a (1,0,0) crystal face of silicon. For example, the first through-hole 58 and the second through-hole 57 can be formed by processing the first base body 50 by using an etching technology such as a dry process and a wet process.

The second through-hole 57 is provided to fill the grooves 15, 16, and 17, which communicate with the inside and outside of the accommodation space portion 56, with the filling member 60 so as to clog the gap between the grooves 15, 16, and 17, and the first base body 50.

As illustrated in FIGS. 1 and 2, in a plan view in the +Z-axis direction, the second through-hole 57 is provided at a position that overlaps the grooves 15, 16, and 17, and communicates with the grooves 15, 16, and 17 in a state of not being filled with the filling member 60.

It is preferable that the second through-hole 57 has a shape (tapered shape) in which an opening diameter thereof decreases toward the second base body 10 (from the +Z-axis side of the first base body 50 toward the −Z-axis side thereof). According to this, it is possible to easily fill the grooves 15, 16, and 17 with the filling member 60.

The grooves 15, 16, and 17 are filled with the filling member 60 from the second through-hole 57, and as illustrated in FIG. 3, the grooves 15, 16, and 17, and the second through-hole 57 are covered with the filling member 60. According to this, air-tight bonding of the outer periphery of the accommodation space portion 56, which is formed between the second base body 10 and the first base body 50, is performed with the bonding region 55 and the filling member 60.

For example, an insulating material such as silicon oxide ($SiO_2$) is used as the filling member 60. The filling member 60 can be formed as an insulating film through plasma chemical vapor deposition (CVD) in which tetra ethyl ortho silicate (TEOS) and the like are used as a raw material. When the insulating material is used as the filling member 60, in the electronic device 100, the plurality of interconnections 20, 22, and 24 are not short-circuited, and thus high air-tightness can be obtained.

Description has been made with respect to the case of using silicon oxide ($SiO_2$) as the filling member 60, but there is no limitation thereto. In addition to the above-described material, as the filling member 60, silicon nitride (SiN) that is formed through plasma CVD in which a silane gas and the like used as a raw material, a polymeric organic material (for example, polyimide) which is capable of performing the filling by a potting or application method, and the like can be used.

The first through-hole 58 is provided to be clogged with the sealing member 70 under decompression in a state in which a gas inside the accommodation space portion 56 is exhausted from the first through-hole 58, or under an inert gas atmosphere in which an inert gas or the like is introduced after exhaustion so as to air-tightly seal the accommodation space portion 56 in a desired atmosphere.

As illustrated in FIGS. 1 and 2, the first through-hole 58 has an approximately rectangular shape in a plan view in the +Z-axis direction, and communicates with the accommodation space portion 56 in a state prior to sealing with the sealing member 70.

The accommodation space portion 56 is air-tightly sealed by clogging the first through-hole 58 with the sealing member 70 under a desired atmosphere after filling the grooves 15, 16, and 17 with the sealing member 60. Specifically, a spherical sealing member 70 (refer to FIG. 4) is disposed inside the first through-hole 58, and the spherical sealing member 70 is melted, for example, through laser irradiation, thereby clogging the first through-hole 58.

As illustrated in FIG. 4, in a cross-sectional view of the first through-hole 58, the first through-hole 58 has a first inclined portion 71 that is inclined from a second surface 52 toward the first main surface 51, and a second inclined portion 72 that is inclined from one end on a first main surface 51 side of the first inclined portion 71 toward the first main surface 51.

An opening length W1 on a second surface 52 side of the first inclined portion 71 is smaller than a diameter D1 of the spherical sealing member 70, and an opening length W3 on a first main surface 51 side of the first inclined portion 71 (on a second surface side of the second inclined portion 72) is larger than the opening length W1 on a second surface 52 side. An opening length W2 on a first main surface 51 side of the second inclined portion 72 is larger than the diameter D1 of the spherical sealing member 70. According to this configuration, in a plan view from the first main surface 51 side (in the +Z-axis direction), the spherical sealing member 70 before melting can be disposed at a position that overlaps the opening on a second surface 52 side of the first inclined portion 71.

Here, an electronic device 300 of the related art in which the second inclined portion 72 is not provided in the first through-hole 58 will be described.

Figure 16A:
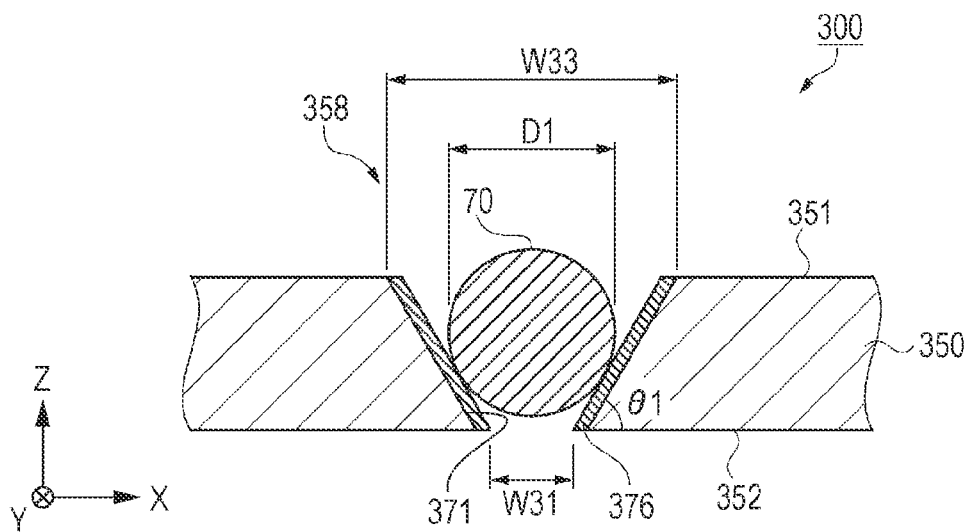
FIGS. 16A and 16B are cross-sectional views of a through-hole according to the related art.
Figure 16B:
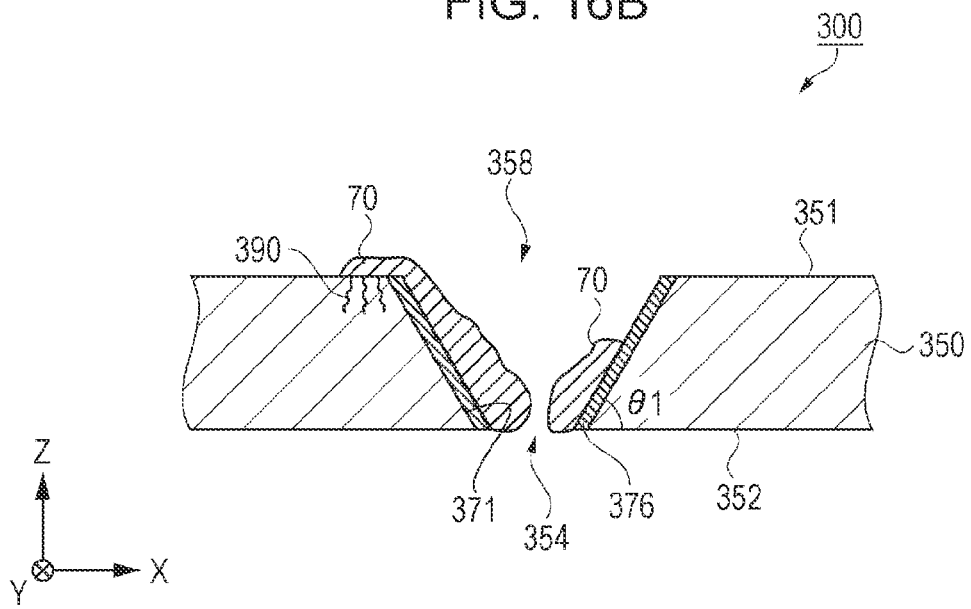

FIGS. 16A and 16B are cross-sectional views of a through-hole according to the related art. FIGS. 16A and 16B are enlarged views of the portion IV in FIG. 2 on the assumption that the second inclined portion 72 is not provided. FIG. 16A illustrates a state in which the spherical sealing member 70 before melting is disposed in a first through-hole 358, and FIG. 16B illustrates an example of a state when the sealing member 70 is melted.

As illustrated in FIG. 16A, the first through-hole 358 is provided in the first base body 350 from a first main surface 351 of the first base body 350 toward a second surface 352. In a cross-sectional view of the first through-hole 358, the first through-hole 358 has a first inclined portion 371 that is inclined from the second surface 352 toward the first main surface 351. An opening length W31 on a second surface 352 side of the first inclined portion 371 is smaller than an opening length W33 on a first main surface 351 side, and is smaller than the diameter D1 of the spherical sealing member 70. An opening length W33 on a first main surface side 351 of the first inclined portion 371 is larger than the diameter D1 of the spherical sealing member 70. In addition, a metal film 376 is provided on the entirety of the inner wall (the first inclined portion 371) of the first through-hole 358.

As illustrated in FIG. 16B, the first through-hole 358 has the first inclined portion 371, and the metal film 376 is provided on the entirety of the inner wall of the first through-hole 358. Accordingly, when melting the spherical sealing member 70, there is a concern that the sealing member 70 that is melted climes up the first inclined portion 371 of the first through-hole 358, and flows out to the first main surface 351 of the first base body 350. According to this, a vacancy 354 may occur due to deficiency of the sealing member 70 inside the first through-hole 358, or cracks 390 may occur in the first base body 350 due to heat of the sealing member 70 that flows out to the first main surface 351, and thus air-tightness of the accommodation space portion 56 may be damaged. When the air-tightness of the accommodation space portion 56 is damaged, detection accuracy of acceleration that is applied to the electronic device 300 tends to decrease.

Returning to FIG. 4, the first through-hole 58 of the electronic device 100 will be described.

A first angle on a first base body 50 side which is made by the first inclined portion 71 of the first through-hole 58 and the second surface 52 is set as $\theta 1$, and a second angle on a first base body 50 side which is made by the second inclined portion 72 and the second surface 52 is set as $\theta 2$, there is a relationship of $\theta 2 > \theta 1$ in the first through-hole 58. In addition, the second angle $\theta 2$ in this embodiment exceeds 90°. The opening of the second inclined portion 72 gradually decreases toward the first main surface 51, and the opening length W2 on a first main surface 51 side of the second inclined portion 72 is smaller than the opening length W3 on a first main surface 51 side of the first inclined portion 71 (on a second surface 52 side of the second inclined portion 72). In other words, the inner wall of the second inclined portion 72 extends in an overhang shape from one end on a first main surface 51 side of the first inclined portion 71 toward the first main surface 51.

In addition, the metal film 76 is provided on the inner wall of the first through-hole 58, and the first base body 50 is exposed at least at a part of the second inclined portion 72. In this embodiment, the metal film 76 is not provided to the second inclined portion 72, and thus the first base body 50 is exposed.

According to this configuration, when melting the spherical sealing member 70 that is disposed at the first inclined portion 71 of the first through-hole 58, the sealing member 70, which tends to climb up the first inclined portion 71 and tends to flow out to the first main surface 51, is blocked by the second inclined portion 72. In addition, the metal film 76 is not formed at the second inclined portion 72, and thus it is possible to reduce wet-spreading (climbing-up) of the sealing member 70 in this region. According to this, it is possible to prevent the sealing member 70 from flowing out from the first through-hole 58 to the first main surface 51, and thus it is possible to improve air-tightness of the electronic device 100.

As a material of the metal film 76, for example, gold (Au) and the like can be used.

As the sealing member 70, for example, alloys such as Au/Ge, Au/Si, Sn/Pb, Pb/Ag, Sn/Ag/Cu, and Sn/Zn/Bi can be used.

In the electronic device 100 of this embodiment, an inert gas such as nitrogen and argon is enclosed in the accommodation space portion 56 in a decompression state (from atmospheric pressure to 0.1 atm). According to this, it is possible to maintain detection accuracy of acceleration that is applied to the electronic device 100 over a long period of time.

In addition, in this embodiment, a configuration, in which in a plan view from the +Z-axis direction, the first through-hole 58 is provided in the first base body 50, and is disposed at a position that overlaps the functional element 80, is illustrated, but there is no limitation thereto. A configuration, in which the first through-hole 58 is disposed at a position that does not overlap the functional element 80, is also possible. In addition, a configuration, in which the first through-hole 58 is provided in the second base body 10, is also possible.

Next, a method of manufacturing the electronic device 100 will be described.

Figure 5:
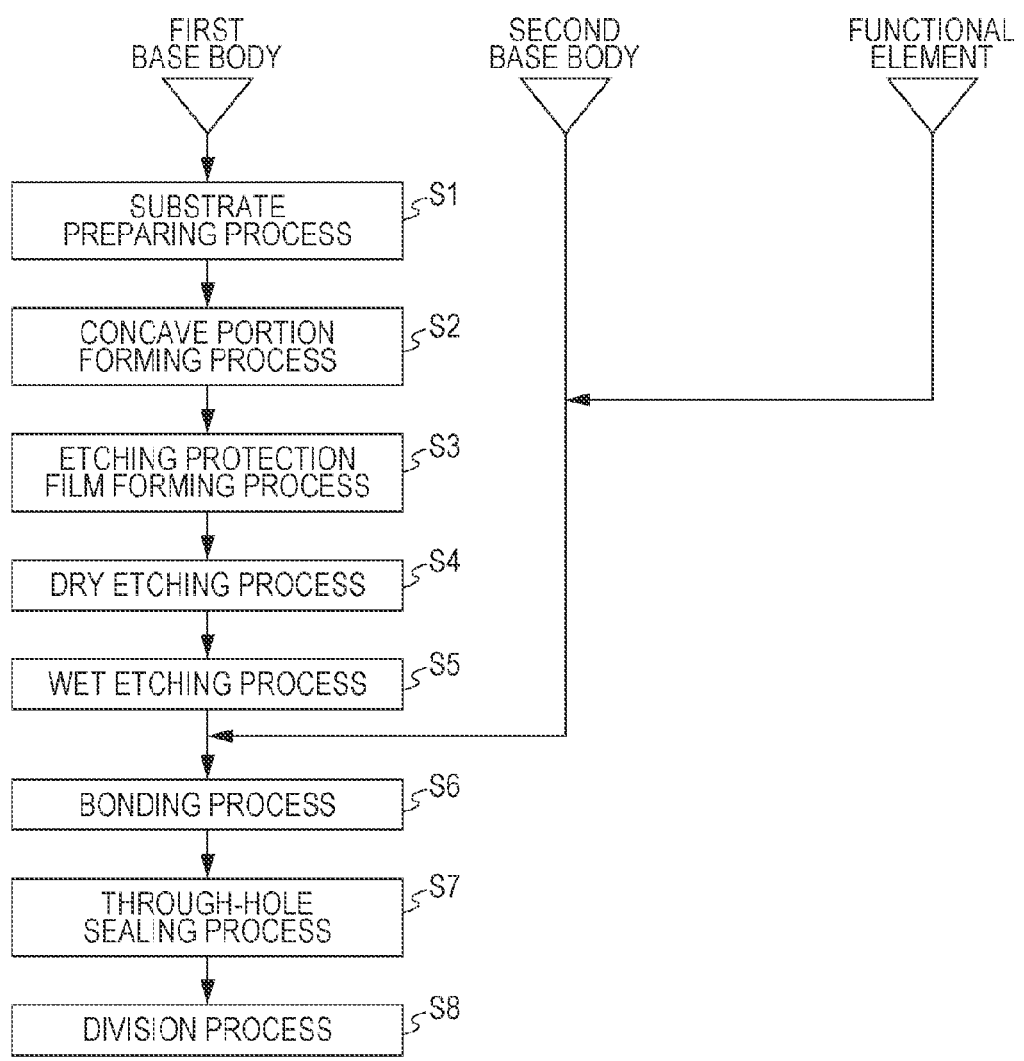
FIG. 5 is a manufacturing process diagram of an electronic device.

FIG. 5 is a manufacturing process diagram illustrating a method of manufacturing the electronic device 100. FIGS. 6A to 6F, and FIGS. 7G to 7J are cross-sectional views for main processes of the electronic device 100.

The method of manufacturing the electronic device 100 includes a dry etching process of half-etching the first main surface 51 of the first base body 50 in a dry process, and a wet etching process of forming the first inclined portion 71 and the second inclined portion 72 of the first through-hole 58 through etching in a wet process.

First, as illustrated in FIG. 5, in a substrate preparation process in step S1, a substrate for formation of the first base body 50 is prepared. As illustrated in FIG. 6A, a silicon substrate (wafer) 150, which has a (1,0,0) crystal surface with respect to the first main surface 51 in which the first through-hole 58 is to be formed, is prepared. A plurality of the first base bodies 50 are collectively formed on a wafer through processing in a wafer state.

In a concave portion forming process in step S2, a concave portion 53 that becomes a part of the accommodation space portion 56 is formed in the first base body 50 (silicon substrate 150). FIG. 6B is a cross-sectional view after forming the concave portion 53 in the first base body 50.

The concave portion 53 can be formed by a photolithography technology, or an etching technology using a wet process or a dry process. However, in this embodiment, in addition to the concave portion 53, the above-described second through-hole 57, and a concave portion 59 are formed. The concave portion 59 becomes a protective portion that temporarily covers the external connection terminals 30, 32, and 34 (refer to FIGS. 1 and 2) which are formed on the second base body 10.

In an etching protection film forming process in step S3, an etching protection film for a dry process of forming the first through-hole 58 is formed. FIG. 6C is a cross-sectional view after patterning the shape of the first through-hole 58 in an etching protection film 120 for the dry process.

First, an etching protection film 110 for a wet process is formed on both surfaces of the first base body 50 in which the concave portion 53 and the like are formed. In this embodiment, a silicon oxide (SiO$_2$) film, which is obtained by thermal oxidation of a silicon surface and which has a thickness of approximately 800 nm, is used for the etching protection film 110.

Next, the etching protection film 120 for the dry process is applied to a first main surface 51 side in which the etching protection film 110 is formed, and the shape of the first through-hole 58 is patterned. As the etching protection film 120, a photosensitive resin (photoresist) is used, and the shape of the first through-hole 58 can be patterned by using a photolithography technology and the like. Description has been made with respect to the case of using the silicon oxide film as the etching protection film 110, but there is no limitation thereto as long as heat resistance is provided in wet etching to be described later.

In a dry etching process in step S4, etching is performed by using a dry process to open the shape of the first through-hole 58 in the etching protection film 110. In addition, the first base body 50 is half-etched. FIG. 6D is a cross-sectional view after peeling off the etching protection film 120 for a dry process by performing dry etching with respect to the etching protection film 110 and the first base body 50.

When the etching protection film 110 is dry-etched, a shape on a first main surface 51 side of the first through-hole 58 is opened in the etching protection film 110. In addition, over-etching is performed to half-etch the first base body 50, thereby forming the through-hole, which extends toward the second surface 52 from the first main surface 51, partway through the first base body 50.

After the dry etching, the etching protection film 120 is peeled off. The silicon oxide (etching protection film 120) and the silicon substrate 150 (first base body 50) can be etched by using, for example, a fluorine-based gas such as CHF$_3$ and CF$_4$. In addition, the etching protection film 120 can be peeled off through dry etching using, for example, O$_2$ gas.

In a wet etching process in step S5, etching is performed by using a wet process to form the first through-hole 58. FIG. 6E is a cross-sectional view after forming the first inclined portion 71 and the second inclined portion 72 by performing wet etching with respect to the through-hole that is formed partway through the first base body 50 in step S4.

When the silicon substrate 150 (first base body 50) is wet-etched by using a potassium hydroxide (KOH) aqueous solution, the first inclined portion 71 and the second inclined portion 72 are formed along a crystal face orientation of a (1,1,1) face through anisotropic etching of silicon. Specifically, in a case of wet-etching the silicon substrate 150 at a liquid temperature of approximately 80° by using, for example, potassium hydroxide (KOH) aqueous solution of approximately 25% by weight as an etchant, an etching rate of a (1,0,0) face is approximately 0.6 μm/min, and an etching rate of a (1,1,1) face is approximately 0.006 μm/min. The etching rate of the (1,1,1) face is as slow as approximately 1/100 times the etching rate of the (1,0,0) face. Accordingly, when the etching progresses, and thus the (1,1,1) face is exposed, the etching behaves as if the etching is stopped, and thus the first inclined portion 71 and the second inclined portion 72, which have the above-described cross-sectional shape, are formed.

As illustrated in FIG. 6F, after the wet etching, the etching protection film 110 is removed, and thus the first through-hole 58 is formed. For example, the etching protection film 110 can be removed through wet etching by using buffered hydrofluoric acid (BHF).

In a bonding process in step S6, the first base body 50 and the second base body 10 are bonded to each other, FIG. 7G is a cross-sectional view after the first base body 50 and the second base body 10 are bonded to each other.

A plurality of the second base bodies 10 are collectively formed in the wafer through processing in a wafer state. The concave portion 14, the grooves 15, 16, and 17, the interconnections 20, 22, and 24, and the external connection terminals 30, 32, and 34 (refer to FIG. 1) are provided to the second base body 10, and the functional element 80 is disposed in the concave portion 14. The metal film 76 is provided in advance to the first base body 50 at the first inclined portion 71 of the first through-hole 58. The bonding is performed in a state in which the concave portion 53 of the first base body 50 and the concave portion 14 of the second base body 10 face each other, and thus the functional element 80 is surrounded by the accommodation space portion 56. An anode bonding method is used for the bonding of the first base body 50 and the second base body 10. The bonding method is not limited to the anode bonding method, and a bonding method using an adhesive, a direct bonding method, and the like can be used.

In addition, the metal film 76 may be formed after bonding of the first base body 50 and the second base body 10. In this case, for example, the metal film 76 can be formed through sputtering using an opening mask.

Next, the grooves 15, 16, and 17 which communicate with the inside and outside of the accommodation space portion 56, are clogged by using the second through-hole 57. In a plan view, the second through-hole 57 is provided at a position that overlaps the grooves 15, 16, and 17 (refer to FIG. 1), and communicates with the grooves 15, 16, and 17. Filling by using the filling member 60 is performed from the second through-hole 57, and thus the grooves 15, 16, and 17, and the second through-hole 57 are covered with the filling member 60. According to this, air-tight bonding of the outer periphery of the accommodation space portion 56 can be performed with the bonding region 55 and the filling member 60.

For example, the filling member 60 can be formed as an insulating film through plasma CVD by using an insulating material such as silicon oxide ($SiO_2$). In addition, so as to prevent the filling member 60 from adhering to the external connection terminals 30, 32, and 34 during film formation, the first base body 50 is extended, and a concave portion 59 provided in the first base body 50 covers the external connection terminals 30, 32, and 34 (refer to FIG. 1).

In a through-hole sealing process in step S7, the first through-hole 58 is clogged with the sealing member 70. FIG. 7H is a cross-sectional view illustrating a state in which the spherical sealing member 70 before melting is disposed in the first through-hole 58. FIG. 7I is a cross-sectional view illustrating a state in which the sealing member 70 is melted to clog the first through-hole 58 and the accommodation space portion 56 is air-tightly sealed.

First, the spherical sealing member 70 is disposed in the first through-hole 58.

Next, a gas inside the accommodation space portion 56 is exhausted from the first through-hole 58 by using a vacuum chamber (not illustrated) and the like, and then an inert gas such as nitrogen and argon is introduced into the vacuum chamber so as to substitute a gas inside the accommodation space portion 56 with the inert gas. In a state in which the inside of the vacuum chamber is maintained at a decompression state (atmospheric pressure to 0.1 atm), when the spherical sealing member 70 is irradiated with a laser, the sealing member 70 that is melted wet-spreads along the metal film 76, thereby clogging the first through-hole 58. According to this, it is possible to air-tightly seal the accommodation space portion 56.

As the laser, a YAG laser, a $CO_2$ laser, and the like can be used.

In a cross-sectional view of the first through-hole 58, the first through-hole 58 of this embodiment is provided with the second inclined portion 72 that extends in an overhang shape from one end on a first main surface 51 side of the first inclined portion 71 toward the first main surface 51, and the metal film 76 is not provided to the second inclined portion 72. Accordingly, when melting the sealing member 70, it is possible to prevent the sealing member 70 that is melted from climbing up the second inclined portion 72 and flowing out to the first main surface 51 from the first through-hole 58.

In a division process in step S8, the electronic device 100 is divided into individual pieces. FIG. 7J is a cross-sectional view after the electronic device 100 is divided into individual pieces.

After removing an unnecessary portion of the first base body 50, the electronic device 100 that is formed in a wafer state is divided into individual pieces by a cutting device such as a dicing saw (not illustrated).

Through the above-described respective processes, it is possible to obtain the electronic device 100 as illustrated in FIGS. 1 to 4.

As described above, according to the electronic device 100 related to this embodiment, it is possible to obtain the following effects.

The first through-hole 58 of the electronic device 100 has the first inclined portion 71 that is inclined from the second surface 52 toward the first main surface 51, and the second inclined portion 72 that is inclined from one end on a first main surface 51 side of the first inclined portion 71 toward the first main surface 51.

In a cross-sectional view of the first through-hole 58, the second inclined portion 72 extends in an overhang shape from one end on a first main surface 51 side of the first inclined portion 71 toward the first main surface 51. According to this shape, when melting the spherical sealing member 70 that is disposed at the first inclined portion 71 of the first through-hole 58, the sealing member 70, which tends to climb up the first inclined portion 71 and tends to flow out to the first main surface 51, is blocked by the second inclined portion 72.

In addition, the metal film 76 is provided in the first inclined portion 71 and the metal film 76 is not provided in the second inclined portion 72. Accordingly, a phenomenon, in which the sealing member 70 climbs up (wet-spreads) the second inclined portion 72 from the first inclined portion 71, is also reduced.

According to this, it is possible to prevent the sealing member 70 from flowing out to the first main surface 51 from the first through-hole 58, and thus it is possible to reliably seal the accommodation space portion 56. Accordingly, it is possible to provide the package 101 in which air-tightness is improved, and the electronic device 100 which uses the package 101 and in which reliability is improved.

In addition, the method of manufacturing the electronic device 100 includes the dry etching process of half-etching the first main surface 51 of the first base body 50 in a dry process, and the wet etching process of etching the first inclined portion 71 and the second inclined portion 72 in a wet process. As a main material of the first base body 50, silicon having a (1,0,0) crystal face with respect to the first main surface 51 in which the first through-hole 58 is formed is used.

When the first main surface 51 is half-etched in a dry process by using anisotropic silicon etching, and then the wet-etching is performed, it is possible to form the first through-hole 58 including the first inclined portion 71 and the second inclined portion 72 in the first base body 50. According to the manufacturing method, it is possible to form the second inclined portion 72 that extends in an overhang shape from one end on a first main surface 51 side of the first inclined portion 71 toward the first main surface 51. According to this shape, when melting the spherical sealing member 70 that is disposed at the first inclined portion 71 of the first through-hole 58, the sealing member 70, which tends to climb up the first inclined portion 71 and tends to flow out to the first main surface 51, is blocked by the second inclined portion 72. Accordingly, it is possible to provide a method of manufacturing the electronic device 100 in which air-tightness is improved, and thus reliability is high.

Second Embodiment

Figure 8:
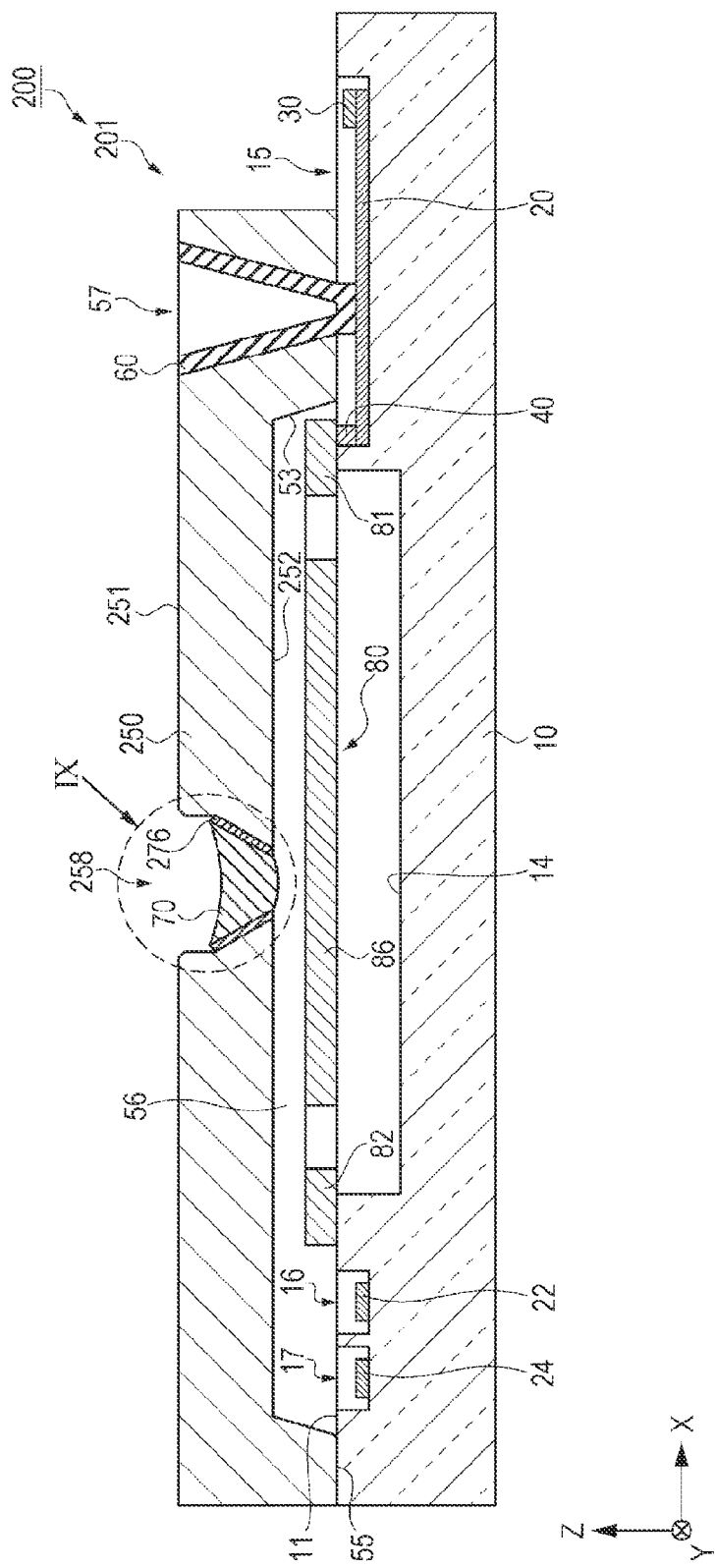
FIG. 8 is a cross-sectional view of an electronic device according to a second embodiment which is taken along line VIII-VIII in FIG. 1.
Figure 9:
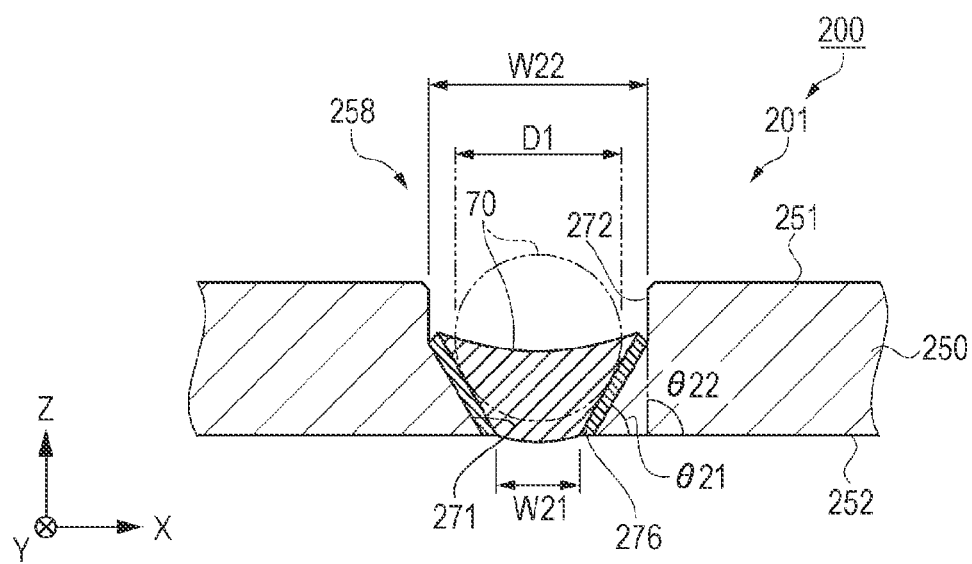
FIG. 9 is an enlarged view of a portion IX in FIG. 8.

FIG. 8 is a cross-sectional view of an electronic device 200 according to a second embodiment which is taken along line VIII-VIII in FIG. 1. FIG. 9 is an enlarged view of a portion IX in FIG. 8.

First, a schematic configuration of the electronic device 200 according to the second embodiment will be described with reference to FIGS. 8 and 9. In addition, the same reference numerals are given to the same constituent portions as those of the electronic devices 100, and redundant description will not be repeated.

As illustrated in FIGS. 8 and 9, a package 201 includes a second base body 10, a first base body 250, a filling member 60, a sealing member 70, and the like, and the electronic device 200 includes the package 201, a functional element 80, and the like.

In a cross-sectional view of a first through-hole 258, the first through-hole 258 has a first inclined portion 271 that is inclined from the second surface 252 toward the first main surface 251, and a second inclined portion 272 that is inclined from one end on a first main surface 251 side of the first inclined portion 271 toward the first main surface 251. In addition, in this embodiment, the second inclined portion 272 has a shape that is erected from one end on a first main surface 251 side of the first inclined portion 271 in a direction intersecting the second surface 252, and has an inclined portion that is inclined from one end on a first main surface 251 side of the second inclined portion 272 toward the first main surface 251.

An opening length W21 on a second surface 252 side of the first inclined portion 271 is smaller than the diameter D1 of the spherical sealing member 70, and an opening length W22 on a first main surface 251 side of the second inclined portion 272 is larger than the diameter D1 of the spherical sealing member 70. According to this shape, in a plan view from a first main surface 251 side (in the +Z-axis direction), the spherical sealing member 70 before melting can be disposed at a position that overlaps the opening on a second surface 252 side of the first inclined portion 271.

A first angle on a first base body 250 side which is made by the first inclined portion 271 of the first through-hole 258 and the second surface 252 is set as θ21, and a second angle on a first base body 250 side which is made by the second inclined portion 272 and the second surface 252 is set as θ22, there is a relationship of θ22>θ21 in the first through-hole 258, and the second angle θ22 is approximately 90°. In other words, the first main surface 251 side of the second inclined portion 272 and the first main surface 251 side of the first inclined portion 271 have approximately the same opening length W22, and the second inclined portion 272 has an inner wall that is erected from one end on a first main surface 251 side of the first inclined portion 271 in a direction intersecting the second surface 252.

In addition, a metal film 276 is provided in the first through-hole 258, and the first base body 250 is exposed at least at a part of the second inclined portion 272. In this embodiment, the metal film 276 is not provided to the second inclined portion 272, and thus the first base body 250 is exposed.

According to this configuration, when melting the spherical sealing member 70 that is disposed at the first inclined portion 271 of the first through-hole 258, the sealing member 70, which climbs up the first inclined portion 271, is blocked by the second inclined portion 272. In addition, the metal film 276 is not formed at the second inclined portion 272, and thus it is also possible to prevent the sealing member 70 from wet-spreading to the second inclined portion 272. According to this, it is possible to prevent the sealing member 70 from flowing out to the first main surface 251 from the first through-hole 258, and thus it is possible to improve air-tightness of the electronic device 200.

Next, a method of manufacturing the electronic device 200 will be described.

Figure 10:
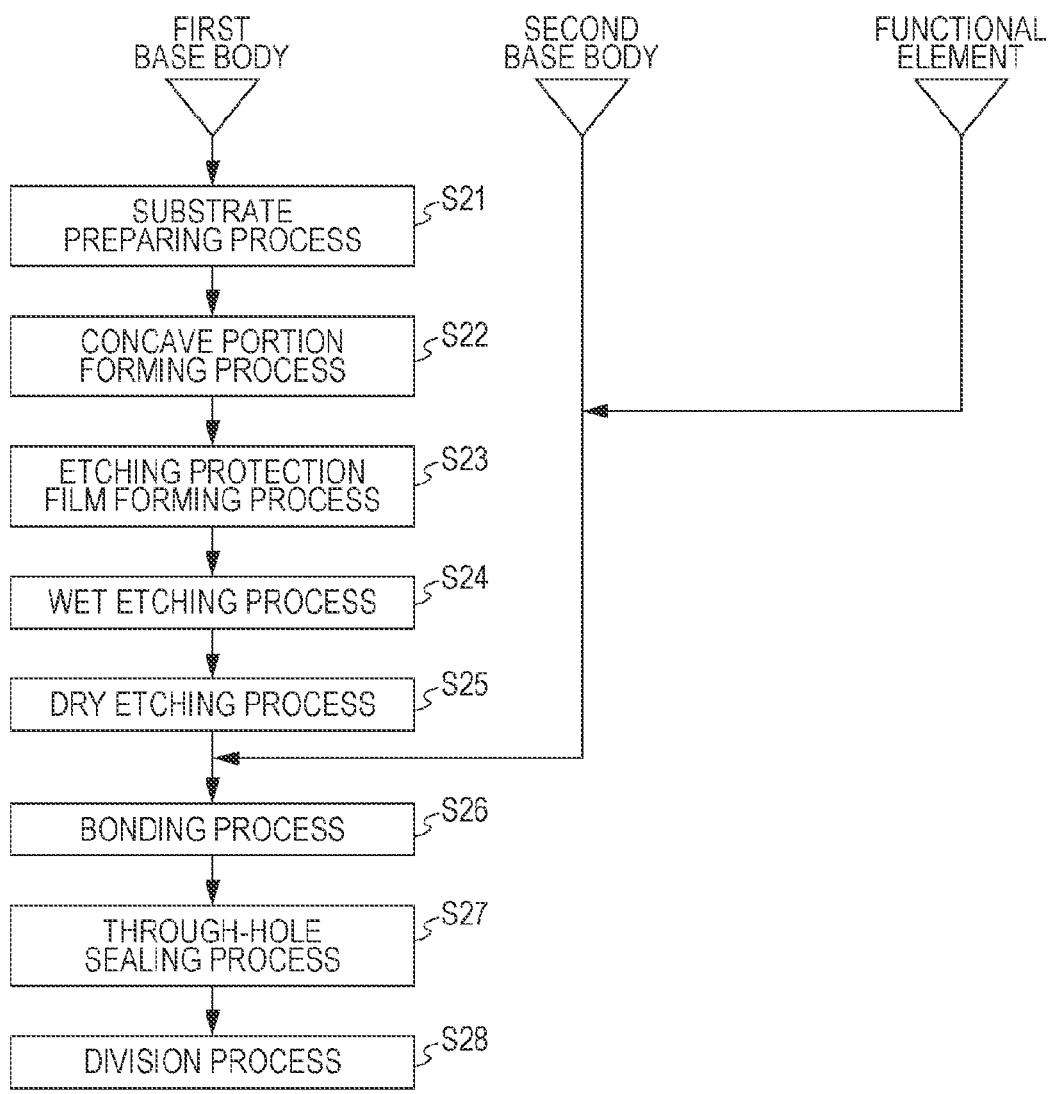
FIG. 10 is a manufacturing process diagram of the electronic device.

FIG. 10 is a manufacturing process diagram illustrating a method of manufacturing the electronic device 200. FIGS. 11A to 11E are cross-sectional views for main processes of the electronic device 200.

In the manufacturing process diagram of the electronic device 200 which is illustrated in FIG. 10, step S21, step S22, and step S26 to step S28 are the same as step S1, step S2, and step S6 to step S8 in the manufacturing process diagram of the electronic device 100 which is illustrated in FIG. 5, and description thereof will not be repeated.

The method of manufacturing the electronic device 200 includes a wet etching process of etching the first main surface 251 of the first base body 250 in a wet process, and a dry etching process of forming the second inclined portion 272 of the first through-hole 258 through etching in a dry process.

Figure 11A:
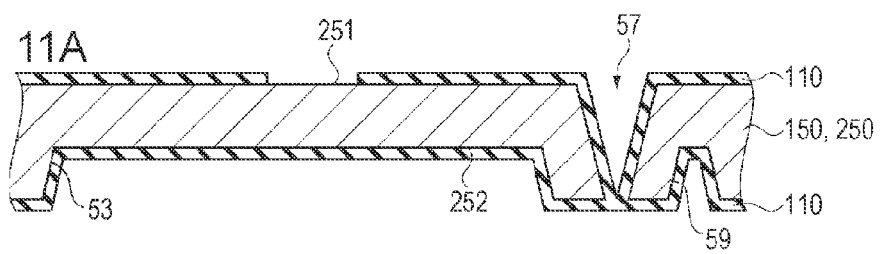
FIGS. 11A to 11E are cross-sectional views for processes of the electronic device.

In an etching protection film forming process in step S23, an etching protection film 110 for a wet process of forming the first through-hole 258 is formed. FIG. 11A is a cross-sectional view after patterning a shape of the first through-hole 258 in the etching protection film 110 for a wet process.

The etching protection film 110 for a wet process is formed on both surfaces of the first base body 250 in which a concave portion 53 and the like are formed. In this embodiment, a silicon oxide ($SiO_2$) film, which is obtained by thermal oxidation of a silicon surface and which has a thickness of approximately 800 nm, is used for the etching protection film 110.

The shape of the first through-hole 258 is patterned in the etching protection film 110 by using a photolithography technology or an etching technology which are known.

In addition, description has been made with respect to the case of using the silicon oxide film as the etching protection film 110, but there is no limitation thereto as long as heat resistance is provided in wet etching to be described later.

Figure 11B:
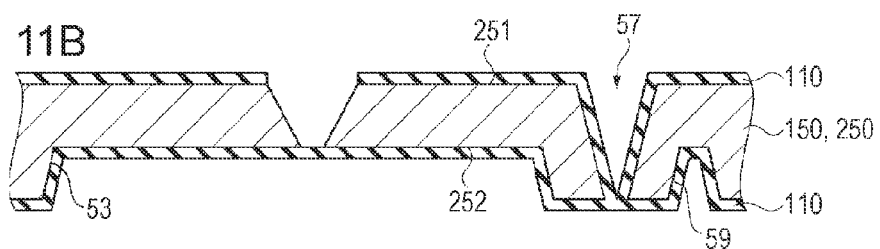

In a wet etching process in step S24, etching is performed in a wet process from the first main surface 251 of the first base body 250 toward the second surface 252. FIG. 11B is a cross-sectional view after a through-hole passes through the first main surface 251 and the second surface 252.

When a silicon substrate 150 (first base body 250) is wet-etched by using a potassium hydroxide (KOH) aqueous solution, a through-hole, which is inclined along a crystal face orientation of a (1,1,1) face, is formed through anisotropic etching of silicon. Specifically, in a case of wet-etching the silicon substrate 150 at a liquid temperature of approximately 80° by using, for example, potassium hydroxide (KOH) aqueous solution of approximately 25% by weight as an etchant, an etching rate of a (1,0,0) face is approximately 0.6 μm/min, and an etching rate of a (1,1,1) face is approximately 0.006 μm/min. The etching rate of the (1,1,1) face is as slow as approximately 1/100 times the etching rate of the (1,0,0) face. Accordingly, when the etching progresses, and thus the (1,1,1) face is exposed, the etching behaves as if the etching is stopped, and thus the through-hole having the same inclination as the first inclined portion 271 is formed.

Figure 11C:
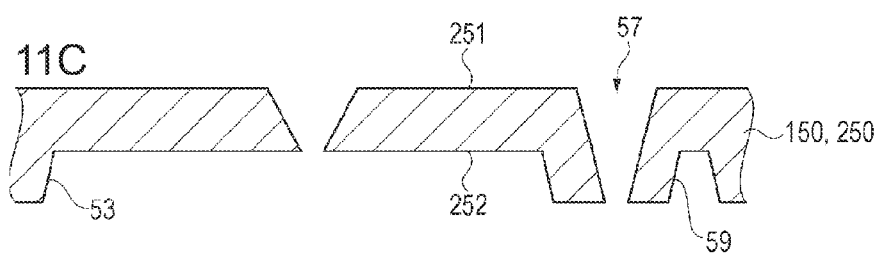

As illustrated in FIG. 11C, after the wet etching, the etching protection film 110 is removed. For example, the etching protection film 110 can be removed through wet etching by using buffered hydrofluoric acid (BHF).

In a dry etching process in step S25, etching is performed in a dry process from the first main surface 251 of the first base body 250 toward the second surface 252. FIG. 11E is a cross-sectional view after the dry etching is performed with respect to the through-hole formed in step S24 to form the first through-hole 258.

Figure 11D:
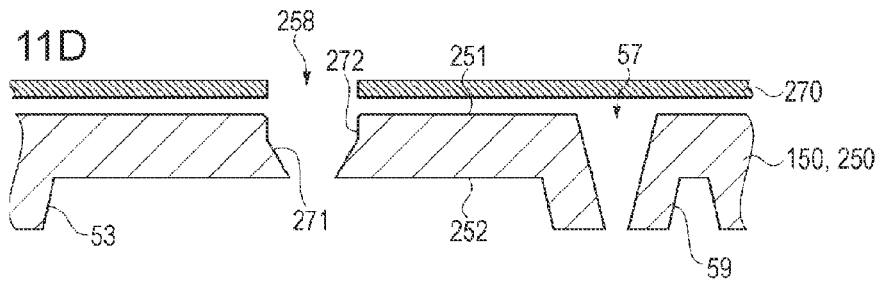
Figure 11E:
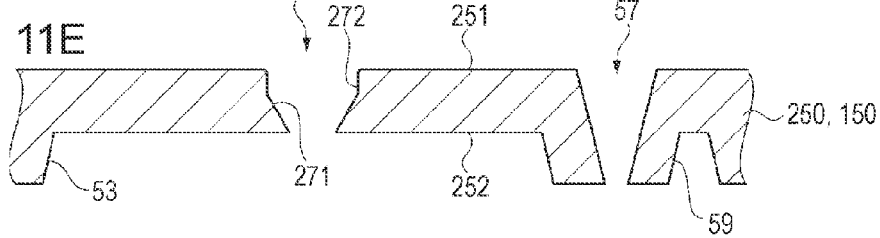

As illustrated in FIG. 11D, an opening mask 270, which is open in accordance with an opening shape on a first main surface 251 side of the first through-hole 258, is superimposed on a first main surface 251 side of the first base body 250, and dry etching is performed from the first main surface 251 of the first base body 250 toward the second surface 252. According to this, it is possible to easily form the first through-hole 258 having the first inclined portion 271 and the second inclined portion 272. The silicon substrate 150 (first base body 250) can be etched by using a fluorine-based gas such as $CHF_3$ and $CF_4$.

In this embodiment, description has been made with respect to the case of performing dry etching by using the opening mask 270, but there is no limitation thereto. The dry etching may be performed after newly forming an etching protection film for a dry process.

As described above, according to the electronic device 200 related to this embodiment, it is possible to obtain the following effects.

The first through-hole 258 of the electronic device 200 has the first inclined portion 271 that is inclined from the second surface 252 toward the first main surface 251, and the second inclined portion 272 that is inclined from one end on a first main surface 251 side of the first inclined portion 271 toward the first main surface 251.

In a cross-sectional view of the first through-hole 258, the second inclined portion 272 has an inner wall that is erected from one end on a first main surface 251 side of the first inclined portion 271 in a direction intersecting the second surface 252. According to this shape, when melting the spherical sealing member 70 that is disposed at the first inclined portion 271 of the first through-hole 258, the sealing member 70, which climbs up the first inclined portion 271, is stopped at the second inclined portion 272.

In addition, the metal film 276 is not formed at the second inclined portion 272, and thus it is possible to prevent the sealing member 70 from wet-spreading to the second inclined portion 272.

According to this, it is possible to prevent the sealing member 70 from flowing out to the first main surface 251 from the first through-hole 258, and thus it is possible to reliably seal the accommodation space portion 56. Accordingly, it is possible to provide the package 201 in which air-tightness is improved, and the electronic device 200 which uses the package 201 and in which reliability is improved.

In addition, the method of manufacturing the electronic device 200 includes the wet etching process of etching the first main surface 251 of the first base body 250 in a wet process, and the dry etching process of forming the second inclined portion 272 of the first through-hole 258 through etching in a dry process. As a main material of the first base body 250, silicon having a (1,0,0) crystal face with respect to the first main surface 251 in which the first through-hole 258 is formed is used.

When the wet etching is performed from the first main surface 251 toward the second surface 252 by using anisotropic silicon etching, it is possible to form the through-hole that is inclined along the (1,1,1) crystal face. In addition, when the through-hole is subjected to etching with a dry process from the first main surface 251 toward the second surface 252, it is possible to form the first through-hole 258, which includes the first inclined portion 271 and the second inclined portion 272, in the first base body 250. According to the manufacturing method, in a cross-sectional view of the first through-hole 258, it is possible to form the first inclined portion 271 in which the opening length W22 on a first main surface 251 side is wider than the opening length W21 on a second surface 252 side, and the second inclined portion 272 having the inner wall that is erected from one end on a first main surface 251 side of the first inclined portion 271 in a direction intersecting the second surface 252. According to this shape, when melting the spherical sealing member 70 that is disposed at the first inclined portion 271 of the first through-hole 258, the sealing member 70 that climbs up the first inclined portion 271 is stopped at the second inclined portion 272. According to this, it is possible to prevent the sealing member 70 from flowing out to the first main surface 251 from the first through-hole 258, and thus it is possible to reliably seal the accommodation space portion 56. Accordingly, it is possible to provide a method of manufacturing the electronic device 200 in which air-tightness is improved, and thus reliability is high.

Electronic Apparatus

Next, an electronic apparatus provided with the electronic device according to the embodiment of the invention will be described with reference to FIGS. 12 to 14. In addition, in the description, an example of using the electronic device 100 is illustrated.

Figure 12:
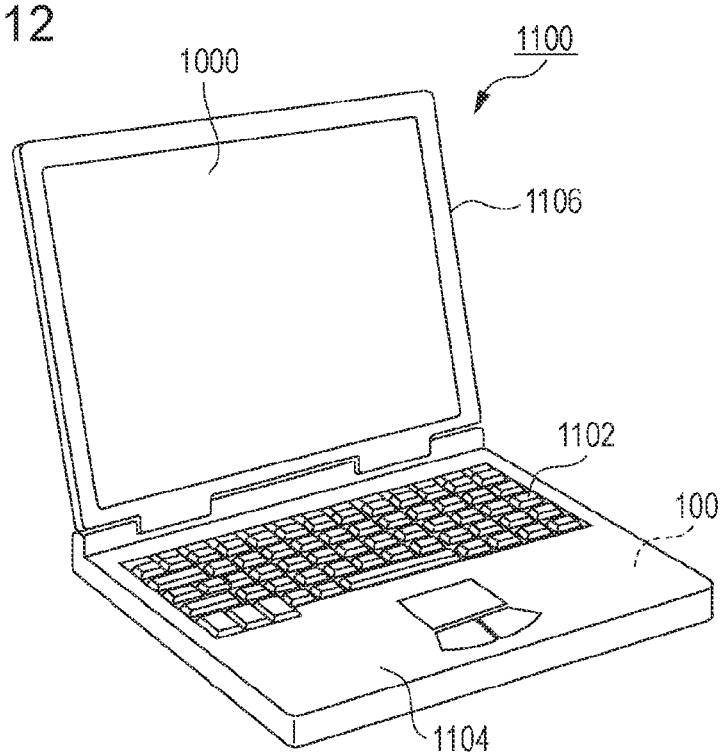
FIG. 12 is a perspective view illustrating a configuration of a mobile-type (or notebook type) personal computer as an electronic apparatus provided with the electronic device.

FIG. 12 is a perspective view illustrating a schematic configuration of a mobile type (or notebook type) personal computer 1100 as an example of the electronic apparatus provided with the electronic device 100 according to an embodiment of the invention. As illustrated in FIG. 12, the personal computer 1100 is constituted by a main body portion 1104 including a keyboard 1102, and a display unit 1106 including a display portion 1000. The display unit 1106 is rotatably supported to the main body portion 1104 through a hinge structure portion. The electronic device 100 that has a function of detecting acceleration is built into the personal computer 1100.

Figure 13:
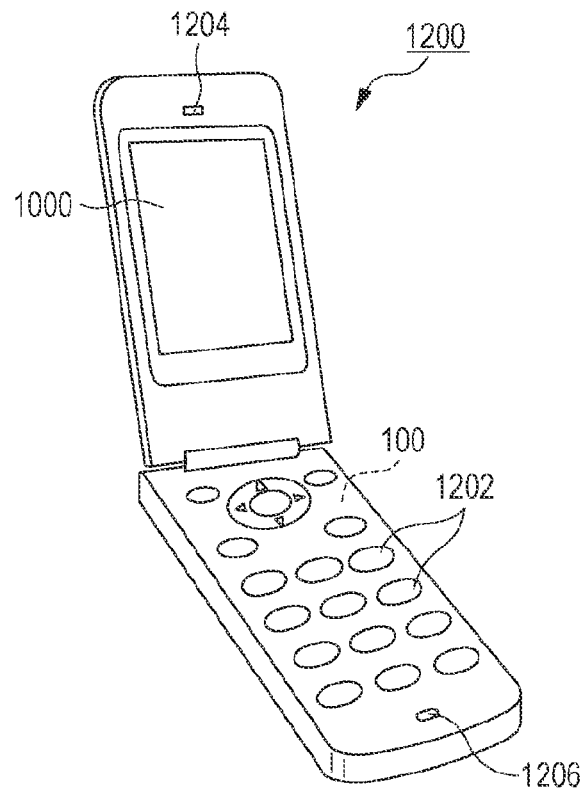
FIG. 13 is a perspective view illustrating a portable telephone as an electronic apparatus provided with the electronic device.

FIG. 13 is a perspective view illustrating a schematic configuration of a portable telephone 1200 (also including PHS) as an example of the electronic apparatus provided with the electronic device 100 according to an embodiment of the invention. As illustrated in FIG. 13, the portable telephone 1200 includes a plurality of operation buttons 1202, an earpiece 1204, and a mouthpiece 1206, and a display portion 1000 is disposed between the operation buttons 1202 and the earpiece 1204. The electronic device 100 that functions as an acceleration sensor and the like is built into the portable telephone 1200.

Figure 14:
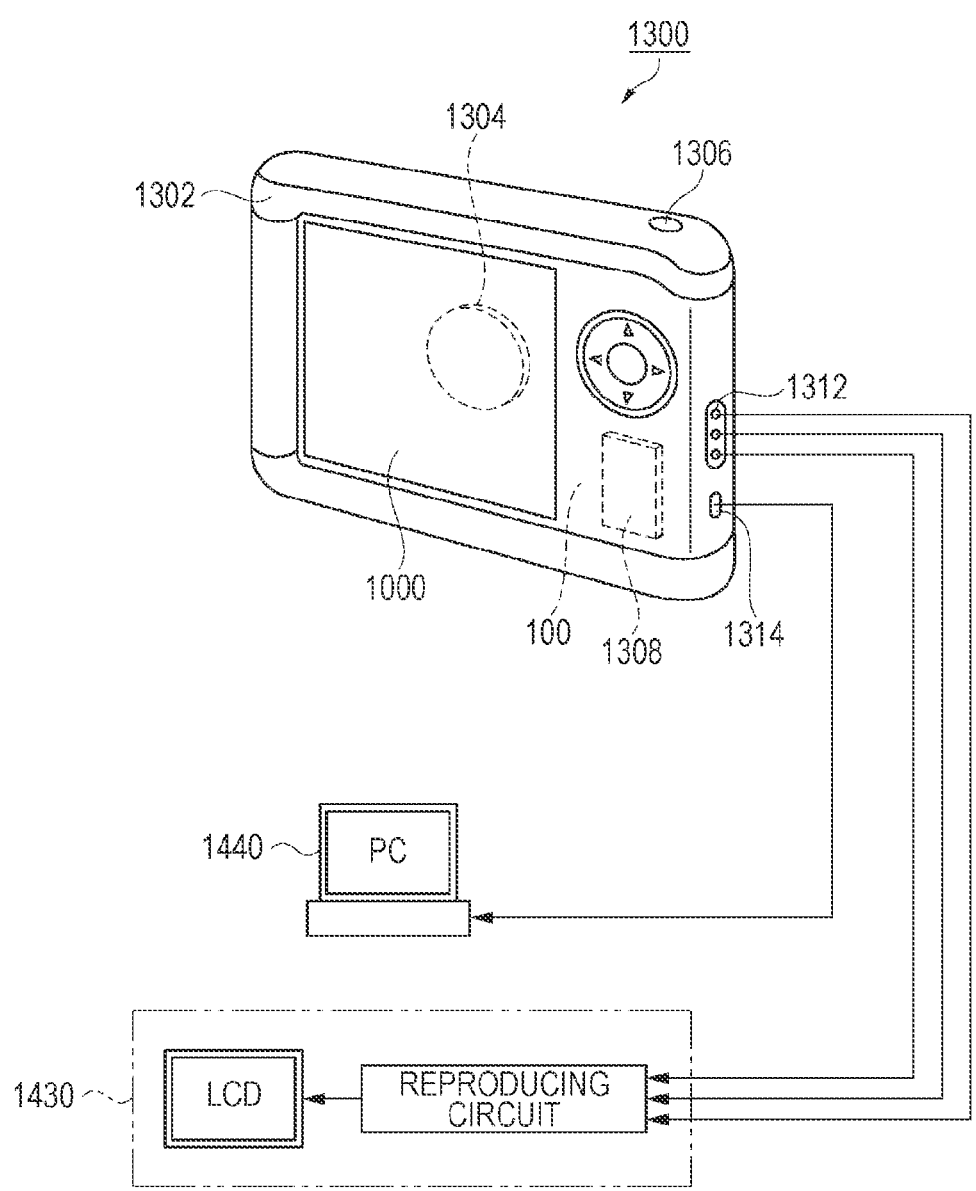
FIG. 14 is a perspective view illustrating a digital still camera as an electronic apparatus provided with the electronic device.

FIG. 14 is a perspective view illustrating a schematic configuration of a digital still camera 1300 as an example of the electronic apparatus provided with the electronic device 100 according to an embodiment of the invention. In FIG. 14, connection with an external apparatus is also illustrated in a simple manner. Here, in a film camera of the related art, a silver halide photographic film is exposed to light by using a photo image of an object. In contrast, in the digital still camera 1300, a photo image of an object is photoelectrically converted by an imaging element such as a charge coupled device (CCD) to generate an imaging signal (image signal).

In the digital still camera 1300, a display portion 1000 is provided on a rear surface of a case (body) 1302, and display is performed on the basis of an imaging signal obtained by the CCD. The display portion 1000 functions as a viewfinder that displays an object as an electronic image. In addition, light-receiving units 1304 including an optical lens (imaging optical system) and the CCD are provided on a front surface side (on a rear surface side in the drawing) of the case 1302.

When a photographer confirms an object image that is displayed on the display portion 1000 and presses a shutter button 1306, an imaging signal obtained by the CCD is transmitted to the memory 1308 at that time and is stored therein. In addition, in the digital still camera 1300, a video signal output terminal 1312 and an input/output terminal 1314 for data communication are provided on a side surface of the case 1302. In addition, as illustrated in the drawing, a television monitor 1430 and a personal computer 1440 are connected to the video signal output terminal 1312 and the input/output terminal 1314 for data communication, respectively, as necessary. In addition, the imaging signal that is stored in the memory 1308 is output to the television monitor 1430 or the personal computer 1440 through a predetermined operation. In the digital still camera 1300, the electronic device 100 as an acceleration sensor and the like is built into the digital still camera.

In addition, the electronic device 100 according to an embodiment of the invention is applicable to, for example, electronic apparatuses such as an ink jet type ejection apparatus (for example, an ink jet printer), a laptop type personal computer, a television, a video camera, a video tape recorder, a car navigation apparatus, a pager, an electronic organizer (also including one equipped with a communication function), an electronic dictionary, a calculator, an electronic gaming machine, a word processor, a work station, a videophone, a security television monitor, electronic binoculars, a POS terminal, a medical apparatus (for example, an electronic thermometer, a blood pressure meter, a blood glucose meter, an electrocardiogram measurement apparatus, an ultrasonic diagnostic apparatus, and an electronic endoscope), a fish finder, various measurement apparatuses, meters (for example, meters of a vehicle, an aircraft, and a ship), and a flight simulator in addition to the personal computer 1100 (mobile type personal computer) in FIG. 12, the portable telephone 1200 in FIG. 13, and the digital still camera 1300 in FIG. 14.

Mobile Body

Next, a mobile body provided with the electronic device according to the embodiment of the invention will be described with reference to FIG. 15. In addition, in the description, an example of using the electronic device 100 is illustrated.

Figure 15:
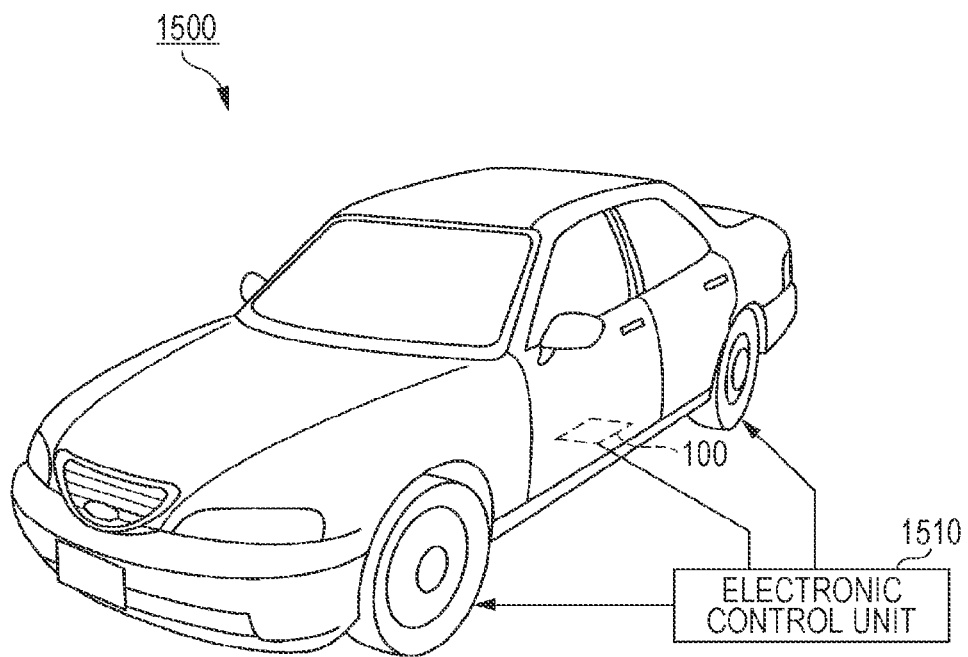
FIG. 15 is a perspective view illustrating an automobile as a mobile body provided with the electronic device.

FIG. 15 is a perspective view schematically illustrating an automobile as an example of the mobile body provided with the electronic device 100 according to an embodiment of the invention.

The electronic device 100 according to the embodiment is mounted on an automobile 1500. As illustrated in FIG. 15, the electronic device 100 is built into the automobile 1500 as the mobile body, and an electronic control unit 1510 that controls a tire and the like is mounted on a vehicle body. In addition to this, the electronic device 100 is broadly applicable to an electronic control unit (ECU) of a keyless entry, an immobilizer, a car navigation system, a car air conditioner, an antilock brake system (ABS), an airbag, a tire pressure monitoring system (TPMS), engine control, a battery monitor of a hybrid vehicle or an electric vehicle, a vehicle body attitude control system, and the like.

The entire disclosure of Japanese Patent Application No. 2014-088893, filed Apr. 23, 2014 is expressly incorporated by reference herein.

What is claimed is:

1. A package, comprising:
an accommodation space portion; and
a first base body that forms at least a part of the accommodation space portion,
wherein a first through-hole, which extends toward a second surface on an accommodation space portion side from a first main surface opposite to the accommodation space portion, is provided in the first base body,
in a cross-section view of the first through-hole, the first through-hole includes a first inclined portion that is inclined from the second surface toward the first main surface, and a second inclined portion that is inclined from one end on a first main surface side of the first inclined portion toward the first main surface,
a second angle made by the second inclined portion and the second surface is larger than a first angle made by the first inclined portion and the second surface, and
the first through-hole is sealed with a sealing member.

2. The package according to claim 1,
wherein the second angle exceeds 90°.

3. The package according to claim 1,
wherein a metal film is provided in the first through-hole, and
the first base body is exposed at least at a part of the second inclined portion.

4. The package according to claim 1,
wherein the first base body includes silicon as a main material, and
the first main surface is formed along a (1,0,0) crystal face of silicon.

5. An electronic device, comprising:
an accommodation space portion;
a first base body that forms at least a part of the accommodation space portion; and
a functional element that is accommodated in the accommodation space portion,
wherein a first through-hole, which extends toward a second surface on an accommodation space portion side from a first main surface opposite to the accommodation space portion, is provided in the first base body,
in a cross-sectional view of the first through-hole, the first through-hole includes a first inclined portion that is inclined from the second surface toward a first main surface side, and a second inclined portion that is inclined from one end on a first main surface side of the first inclined portion toward the first main surface side,
a second angle made by the second inclined portion and the second surface is larger than a first angle made by the first inclined portion and the second surface, and
the first through-hole is sealed with a sealing member.

6. A method of manufacturing an electronic device, comprising:
half-etching a first main surface of a first base body in a dry process; and
forming a first inclined portion and a second inclined portion of a first through-hole through etching in a wet process,
wherein the electronic device includes an accommodation space portion, the first base body that forms at least a part of the accommodation space portion, and a functional element that is accommodated in the accommodation space portion,
the first through-hole, which extends toward a second surface on an accommodation space portion side from a first main surface opposite to the accommodation space portion, is provided in the first base body,
in a cross-sectional view of the first through-hole, the first through-hole includes the first inclined portion that is inclined from the second surface toward a first main surface side, and the second inclined portion that is inclined from one end on a first main surface side of the first inclined portion toward the first main surface side,
a second angle made by the second inclined portion and the second surface is larger than a first angle made by the first inclined portion and the second surface,
the first through-hole is sealed with a sealing member,
the first base body includes silicon as a main material, and
the first main surface is formed along a (1,0,0) crystal face of silicon.

7. A method of manufacturing an electronic device, comprising:
forming a first main surface of a first base body through etching of a wet process; and
forming a second inclined portion of a first through-hole through etching of a dry process,
wherein the electronic device includes an accommodation space portion, the first base body that forms at least a part of the accommodation space portion, and a functional element that is accommodated in the accommodation space portion,
the first through-hole, which extends toward a second surface on an accommodation space portion side from a first main surface opposite to the accommodation space portion, is provided in the first base body, in a cross-sectional view of the first through-hole, the first through-hole includes the first inclined portion that is inclined from the second surface toward a first main surface side, and the second inclined portion that is inclined from one end on a first main surface side of the first inclined portion toward the first main surface side, a second angle made by the second inclined portion and the second surface is larger than a first angle made by the first inclined portion and the second surface, the first through-hole is sealed with a sealing member, the first base body includes silicon as a main material, and the first main surface is formed along a (1,0,0) crystal face of silicon.

8. An electronic apparatus, comprising:
the electronic device according to claim 5.

9. A mobile body, comprising:
the electronic device according to claim 5.

10. The package according to claim 2,
wherein a metal film is provided in the first through-hole, and the first base body is exposed at least at a part of the second inclined portion.

11. The package according to claim 10,
wherein the first base body includes silicon as a main material, and the first main surface is formed along a (1,0,0) crystal face of silicon.

\* \* \* \* \*